US008355454B2

(12) United States Patent
Kanno

(10) Patent No.: US 8,355,454 B2
(45) Date of Patent: Jan. 15, 2013

(54) RECEPTION DEVICE, RECEPTION METHOD AND INTEGRATED CIRCUIT

(75) Inventor: Ippei Kanno, Kyoto (JP)

(73) Assignee: Panasonic Corporation, Osaka (JP)

( * ) Notice: Subject to any disclaimer, the term of this patent is extended or adjusted under 35 U.S.C. 154(b) by 1019 days.

(21) Appl. No.: 12/306,775

(22) PCT Filed: Jul. 31, 2007

(86) PCT No.: PCT/JP2007/064994
§ 371 (c)(1),
(2), (4) Date: Dec. 29, 2008

(87) PCT Pub. No.: WO2008/016051
PCT Pub. Date: Feb. 7, 2008

(65) Prior Publication Data
US 2009/0279647 A1 Nov. 12, 2009

(30) Foreign Application Priority Data
Aug. 3, 2006 (JP) ................................. 2006-211983

(51) Int. Cl.
*H04K 1/10* (2006.01)
(52) U.S. Cl. .......................... 375/260; 375/345; 375/316
(58) Field of Classification Search .................. 375/260, 375/345, 316
See application file for complete search history.

(56) References Cited

U.S. PATENT DOCUMENTS

| 7,225,389 B2 * | 5/2007 | Tsuchie | 714/774 |
| 7,466,969 B2 * | 12/2008 | Kimata et al. | 455/272 |
| 7,482,958 B2 * | 1/2009 | Tanaka et al. | 341/139 |
| 7,787,848 B2 * | 8/2010 | Lin et al. | 455/234.1 |
| 8,059,734 B1 * | 11/2011 | Sun | 375/260 |
| 8,094,709 B2 * | 1/2012 | Kimata | 375/232 |
| 2006/0023800 A1 * | 2/2006 | Okada | 375/260 |
| 2007/0014409 A1 * | 1/2007 | Batra et al. | 380/270 |
| 2007/0274222 A1 * | 11/2007 | Kanno | 370/241 |

(Continued)

FOREIGN PATENT DOCUMENTS

EP 1 313 242 5/2003

(Continued)

OTHER PUBLICATIONS

International Search Report mailed Oct. 30, 2007 for International Application No. PCT/JP2007/064994.

*Primary Examiner* — Sam K Ahn
*Assistant Examiner* — Santiago Garcia
(74) *Attorney, Agent, or Firm* — Wenderoth, Lind & Ponack, L.L.P.

(57) ABSTRACT

A reception device for receiving an OFDM signal whose level is maintained constant by performing an AGC control which adjusts an amplification gain by means of a discrete gain value includes an equalization section operable to execute an equalization process of detecting, respectively, distortions of a plurality of reference subcarriers regularly included in the OFDM signal on which the fast Fourier transform has been performed, and of estimating, by means of an interpolation using the detected distortions, a distortion of the OFDM signal, which distortion is caused by transmission path propagation so as to correct the estimated distortion of the OFDM signal, and the equalization section corrects, by using the AGC control signal, an estimated error of the distortion of the OFDM signal, which distortion is caused by a discrete amplification gain variation of the OFDM signal.

6 Claims, 12 Drawing Sheets

U.S. PATENT DOCUMENTS

2008/0096500 A1* 4/2008 Eilts et al. .................... 455/136
2009/0022217 A1* 1/2009 Kimata ........................ 375/232

FOREIGN PATENT DOCUMENTS

| | | |
|---|---|---|
| EP | 1 742 401 | 1/2007 |
| JP | 2002-261638 | 9/2002 |
| JP | 2004-258932 | 9/2004 |
| JP | 2006-42025 | 2/2006 |
| JP | 2006-74702 | 3/2006 |
| WO | 02/17529 | 2/2002 |
| WO | 2005/109711 | 11/2005 |

* cited by examiner

RECEPTION DEVICE, RECEPTION METHOD AND INTEGRATED CIRCUIT

TECHNICAL FIELD

The present invention relates to an OFDM (Orthogonal Frequency Division Multiplexing) modulated digital broadcasting reception device using a stepped AGC (Automatic Gain Control) which varies a gain of an amplifier in a stepped manner.

BACKGROUND ART

A function of automatically adjusting an amplification gain of an amplifier is referred to as an AGC. Further, a type of the AGC which adjusts a gain by varying the amplification gain in a stepped manner (discretely) is referred to as a stepped AGC. In some cases, the stepped AGC is applied in an OFDM-modulated digital broadcasting reception device for receiving digital broadcasting based on standards such as an ISDB-T (Integrated Service Digital Broadcasting Terrestrial) and a DVB-T (Digital Video Broadcasting Terrestrial).

FIG. 8 is a diagram illustrating an exemplary structure of a conventional OFDM-modulated digital broadcasting reception device 300 that performs the stepped AGC (hereinafter referred to as a reception device 300). As shown in FIG. 8, the reception device 300 comprises an antenna 301, a tuner 302, an analog-digital converter (hereinafter referred to as an ADC) 303, a quadrature demodulation section 304, a level detection section 305, a timing control section 306, a synchronization section 307, an FFT section 308, an equalization section 309, an error correction section 310, a data decoding section 311, and a display section 312.

Hereinafter, an operation of the reception device 300 will be described. The antenna 301 receives an OFDM modulated signal so as to output the received OFDM modulated signal to the tuner 302. The tuner 302 selects a signal having a desired channel from the inputted OFDM modulated signal, converts the selected signal into a predetermined intermediate frequency signal (having a center frequency of 57 MHz, for example) so as to amplify the converted intermediate frequency signal, and finally outputs the signal thus obtained to the ADC 303. Note that the tuner 302 includes a gain variable amplifier for amplifying an intermediate frequency signal. FIG. 9 is a diagram illustrating a relationship between a control signal and a gain of the gain variable amplifier included in the tuner 302. As shown in FIG. 9, a gain of the gain variable amplifier discretely varies because a control signal having discrete values generated by digital signal processing (an AGC control signal) is inputted to the gain variable amplifier. Furthermore, the gain of the gain variable amplifier is increased in increments of 1 dB, for example, so as to correspond to a minimum increment of the control signal. The ADC 303 converts the inputted intermediate frequency signal into a digital signal from an analog signal, and outputs the converted signal to the quadrature demodulation section 304. The quadrature demodulation section 304 performs orthogonal detection on the inputted intermediate frequency signal so as to be converted into an I/Q signal, and outputs the I/Q signal thus obtained to the level detection section 305, the synchronization section 307 and the FFT section 308.

The level detection section 305 detects a difference between an electric power level of the inputted I/Q signal and a desired electric power level, and generates an AGC control signal, which is a control signal to be inputted to the gain variable amplifier of the tuner 302. The synchronization section 307 detects an FFT window position which is a position, of the I/Q signal, at which an FFT (Fast Fourier Transform) is performed by using a correlation with respect to a guard period of the inputted I/Q signal, and notifies the FFT section 308 and the timing control section 306 of the detected FFT window position. The FFT section 308 performs the FFT at the notified FFT window position of the I/Q signal so as to convert the I/Q signal into a signal in a frequency range, and outputs the obtained signal to the equalization section 309. The timing control section 306 calculates a timing at which a stepped AGC control signal is to be outputted to the tuner 302 by using information on the notified FFT window position, and outputs the stepped AGC control signal inputted from the level detection section 305 to the tuner 302 at the timing having been calculated. The gain variable amplifier of the tuner 302 varies an amplification gain in accordance with the stepped AGC control signal inputted thereto.

The equalization section 309 executes an equalization process by performing time axis interpolation and frequency axis interpolation, both of which are to be described in detail below, on the inputted I/Q signal in a frequency range, and then outputs the obtained signal to the error correction section 310. Thus, the equalization section 309 is able to estimate time-based and frequency-based errors generated by the OFDM modulated signal being propagated via a transmission path (space) between a transmission device (not shown) and the reception device 300 (hereinafter referred to as transmission path fluctuation) and to correct the estimated errors. The error correction section 310 performs deinterleave, Viterbi decoding and RS (Read-Solomon) decoding, all of which processing are an error correction process, on the corrected I/Q signal, and outputs a TS (Transport Stream) signal thus obtained to the data decoding section 311. The data decoding section 311 executes a video and an audio data decompression process on the inputted TS signal in compliance with the MPEG2 standard or the like, and outputs the TS signal on which the aforementioned processes have been executed to the display section 312. By using the inputted signal, the display section 312 provides a user with services relating to video or the like.

Hereinafter, the level detection section 305, the synchronization section 307 and the timing control section 306 will be more specifically described.

FIG. 10 is a diagram illustrating an exemplary structure of the level detection section 305. As shown in FIG. 10, the level detection section 305 includes an electric power calculation section 330, a logarithmic conversion section 331, a subtraction section 332, a reference value generation section 333, a loop filter section 334, and a quantization section 335. The electric power calculation section 330 calculates $I^2+Q^2$ using the I/Q signal inputted from the quadrature demodulation section 304 so as to obtain a received electric power, and outputs the result to the logarithmic conversion section 331. Note that in the case where the AGC is performed with reference to a mean value along a time axis of the received electric power, the electric power calculation section 330 further averages the calculated electric power along the time axis thereof. In the case where the AGC is performed with reference to a peak of the received electric power, the electric power calculation section 330 performs peak detection. The logarithmic conversion section 331 executes a process so as to represent an output of the electric power calculation section 330 (the calculated electric power) using logarithms, and outputs the obtained result to the subtraction section 332. This is because a gain of the variable gain amplifier included in the tuner 302 varies in increments of a predetermined dB value (logarithmic value) with respect to the AGC control signal inputted thereto, as already described above with reference to FIG. 9. The reference value generation section 333 generates a reference electric power for causing an output electric power of the variable gain amplifier included in the tuner 302 to converge to a target value, and outputs the generated reference electric power to the subtraction section 332. The subtraction section 332 detects a difference between an output electric power of the logarithmic conversion section 331 and the reference electric power of the reference value generation section 333, and outputs the detected difference to the loop filter section 334. The loop filter section 334 integrates the inputted difference, and outputs the obtained integral value to the quantization section 335. The quantization section 335 quantizes the integral value inputted thereto, and outputs the quantized value to the timing control section 306 as an AGC control signal. Note that the AGC control signal varied in a minimum increment corresponds to a gain, of the variable gain amplifier of the tuner 302, which varies in increments of 1 dB, for example.

FIG. 11 is a diagram describing an operation of the synchronization section 307. To the synchronization section 307, an I/Q signal (a to-be-demodulated signal) outputted from the quadrature demodulation section 304 is inputted (see (a)). As shown in (a), guard periods are indicated by diagonally shaded portions, and all other portions indicate useful symbol periods. A symbol period is constituted by a guard period and a useful symbol period being arranged as a pair. A guard period is constituted by a signal obtained by replicating a signal existing in a trailing end portion of the useful symbol period with which the guard period is paired up. Then, the synchronization section 307 generates a delay signal obtained by delaying the to-be-demodulated signal (a) by the useful symbol period (see (b)). Thereafter, the synchronization section 307 generates a correlation signal of (a) the to-be-demodulated signal (a) and the delay signal (b) (see (c)). As shown in the correlation signal (c), a correlation appears for a period corresponding to the trailing end portion of the useful symbol period of the to-be-demodulated signal (a). Then, the synchronization section 307 performs shift integration on the correlation signal (c) using a guard period length, thereby generating a shift integral signal (see (d)). The shift integral signal (d) reaches its peak at each boundary (see arrows) of the symbol period of the to-be-demodulated signal (a). Next, the synchronization section 307 detects a boundary of each symbol period (a boundary of each OFDM symbol) of the to-be-demodulated signal (a) by using the peak of the shift integral signal (d). Thereafter, in a fundamental environment (non-multipath environment) where neither delay wave nor preceding wave exists, the synchronization section 307 sets, as the FFT window position at which the FFT is performed, a period B obtained by removing a period A corresponding to the guard period length from said each symbol period, the period A being arranged adjacent to another period A such that the two continuously-arranged periods A have their center at the detected boundary of said each symbol period (see (e)). Note that in a reception environment where a delay wave having a guard period length exists (delay wave environment), the synchronization section 307 sets, as the FFT window position, a position delayed, from the FFT window position set in the fundamental wave environment, by a half of the period corresponding to the guard period length (see (f)). Furthermore, in a reception environment where a preceding wave having a guard period length exists (preceding wave environment), the synchronization section 307 sets, as the FFT window position, a position preceding, the FFT window position set in the fundamental wave environment, by a half of the period corresponding to the guard period length (see (g)).

Then, the synchronization section 307 notifies the FFT section 308 and the timing control section 306 of the FFT window positions having been set. The FFT section 308 performs the FFT process on the inputted I/Q signal at each FFT window position (in the period B) having been notified.

Based on said each notified FFT window position (the period B), the timing control section 306 calculates the period A in which no FFT process is performed. Next, the timing control section 306 outputs, within the calculated period A, an AGC control signal inputted from the level detection section 305 to the variable gain amplifier of the tuner 302. Thus, the variable gain amplifier of the tuner 302 is able to vary a gain of an OFDM signal in a stepped manner (discretely) within the period A in which no FFT is performed on the OFDM signal (see (e) to (g) shown in FIG. 11).

As described above, in the case where the stepped AGC is performed, the communication device 300 detects a period (FFT window position) from which a period in which the FFT is performed on an OFDM signal is removed, thereby varying a gain of the OFDM signal in a stepped manner (discretely) within the period in which no FFT is performed. Thus, the communication device 300 is not to be influenced by a discrete gain fluctuation caused by the stepped AGC.

However, the communication device 300 has a problem in that an interpolation error, which is to be described below, occurs in the equalization process executed by the equalization section 309. FIG. 12 is a diagram describing the equalization process executed by the equalization section 309. FIG. 12(b) is an image in which N–6th to Nth symbols of a received OFDM signal are chronologically represented. Note that an OFDM signal is transmitted for each symbol. In the FIG. 12(b), subcarriers included in each symbol are respectively represented by circles, and Mth to M+15th subcarriers are shown as an example of the subcarriers included in each symbol. The Mth to M+15th subcarriers are arranged in an order of modulation frequency. Note that each solid white circle represents a data carrier which is a subcarrier including transmission data. Also, each solid black circle represents a SP (Scattered Pilot) carrier (also referred to as a reference subcarrier) which is a subcarrier whose amplitude and phase at a time of transmission have already been recognized at a reception side. The SP carrier is arranged every 12 carriers in each symbol, and is arranged at a position shifted, from an arrangement position of another SP carrier of an immediately preceding symbol, by three carriers in a direction in which the modulation frequency increases. FIG. 12(a) indicates that a stepped AGC control is performed within a period, in which no FFT is performed), existing between an N–3th symbol and an N–2th symbol (the period A shown in FIG. 11), thereby causing a gain of the variable gain amplifier of the tuner 302 to be multiplied by X.

Hereinafter, a case where the equalization section 309 executes the equalization process on the N–3th symbol will be described as an example. Note that at a time when the equalization process is executed on the N–3th symbol, the N–2th to Nth symbols have already been received and inputted to the equalization section 309. The equalization section 309 compares an amplitude and a phase of an already received SP carrier (herein after referred to as a received SP carrier) with an amplitude and a phase of a SP carrier, at a time of transmission, corresponding to the received SP carrier (hereinafter referred to as a transmitted SP carrier). That is, the equalization section 309 detects distortion of the received SP carrier. Note that the amplitude and the phase of the transmitted SP carrier are already recognized by the equalization section 309. This comparison is made on the respective received SP carriers included in the N–6th to Nth symbols, whereby the equalization section 309 calculates transmission path coefficients, respectively, at positions of the received SP carriers included in the N−6th to Nth symbols. Note that the transmission path coefficient is a value indicating a variation amount of an amplitude and a phase of a received SP carrier with respect to those of a transmitted SP carrier. In other words, a transmission path coefficient is a value indicating distortion of an OFDM signal being transmitted.

Next, the equalization section 309 calculates a transmission path coefficient at a position of each data carrier represented by a solid white circle with a heavy outline included in the N−3th symbol by means of linear interpolation. Note that a transmission path coefficient at a position of an Mth subcarrier included in the Nth symbol is defined as H(N, M).

Firstly, it is assumed that no stepped AGC control is performed, i.e., a gain does not vary at all. In this case, the equalization section 309 calculates a transmission path coefficient H(N−3, M+3) at the position of the M+3th subcarrier (represented by a solid white circle with a heavy outline) included in the N−3th symbol by using a formula 1, which indicates a linear interpolation (time axis interpolation) using a transmission path coefficient H(N−6, M+3) at a position of a solid black circle and a transmission path coefficient H(N−2, M+3) at a position of another solid black circle. Note that the transmission path coefficient H(N−6, M+3) and the transmission path coefficient H(N−2, M−3) are already calculated as described above.

$$H(N-3,M+3)=(1/4)*H(N-6,M+3)+(3/4)*H(N-2,M+3) \quad \text{[Formula 1]}$$

Similarly, the equalization section 309 performs the time axis interpolation, thereby calculating transmission path coefficients H(N−3, M+6), H(N−3, M+9) and H(N−3, M+15). Note that transmission path coefficients H(N−3, M) and H(N−3, M+12) at the positions of the received SP carriers are already calculated. As a result, the equalization section 309 can calculate a transmission path coefficient at a position of every third subcarrier of all the subcarriers included in the N−3th symbol, starting from the Mth SP carrier. Next, the equalization section 309 performs, on the N−3th symbol, interpolation in a direction along a frequency axis of the subcarriers (frequency axis interpolation), thereby calculating the transmission path coefficients at positions of all the subcarriers included in the N−3th symbol. Then, by using the transmission path coefficients of the positions of all the subcarriers, the equalization section 309 cancels (compensates for) the distortion (amplitude and phase errors) of the OFDM signal being propagated via a transmission path, so as to correct the distortion of the OFDM signal.

Next, it is assumed, as shown in FIG. 12, that the stepped AGC control is performed and thus a gain variation is multiplied by X between the N−3th symbol and the N−2th symbol. In this case, a transmission path coefficient H(N−2, M+3) at a position represented by a solid black circle is multiplied by X due to a stepped gain variation (discrete gain variation) so as to become H(N−2, M+3)*X. Therefore, the equalization section 309 calculates the transmission path coefficient H(N−3, M+3) by using a formula 2 indicating the time axis interpolation performed between symbols along which the gain is varied.

$$H(N-3,M+3)=(1/4)*H(N-6,M+3)+(3/4)*H(N-2,M+30)*X \quad \text{[Formula 2]}$$

As indicated above, H(N−3, M+3) of the formula 2 includes an error generated by multiplying H(N−2, M+3) by X with respect to H(N−3, M+3) of formula 1. Similarly, the equalization section 309 performs the time axis interpolation between the symbols along which a gain is varied, thereby calculating the transmission path coefficients H(N−3, M+6), H(N−3, M+9) and H(N−3, M+15), each of the coefficients including an error. Then, the equalization section 309 performs the frequency axis interpolation on the N−3th symbol, thereby calculating the transmission path coefficients at the positions of all the subcarriers included in the N−3th symbol, each of the transmission path coefficients including an error. FIG. 12(c) is an image illustrating how errors generated in the respective symbols shown in FIG. 12(b) (hereinafter referred to as interpolation errors) vary on a symbol-by-symbol basis. In FIG. 12(c), an image enclosed by a rectangular represents an interpolation error of the N−3th symbol. When a heavy line pointed by an arrow indicates a normal transmission path coefficient, an interpolation error is indicated by diagonally shaded areas. Next, by using the transmission path coefficients, each including the interpolation error, the equalization section 309 cancels (compensates for) the distortion (amplitude and phase errors) caused by the OFDM signal being propagated via the transmission path. As a result, a demodulation error of the OFDM signal is generated, thereby resulting in deterioration of the reception performance.

FIG. 13 is a diagram describing a structure of the equalization section 309 included in the reception device 300. As shown in FIG. 13, the equalization section 309 includes a SP separation section 320, a complex division section 321, a SP generation section 322, a time axis interpolation section 324, a frequency axis interpolation section 325, a delay section 326, and a complex division section 327. Hereinafter, operations of the respective components included in the equalization section 309 will be simply described with reference to FIG. 13. To the SP separation section 320, an OFDM signal in a frequency area is inputted from the FFT section 308. The SP separation section 320 separates a SP carrier of the OFDM signal therefrom and outputs the SP carrier to the complex division section 321, and then outputs, to the delay section 326, the OFDM signal from which the SP carrier has been separated. The SP generation section 322 generates a SP carrier having an amplitude and a phase, both of which being synchronized with those of the transmitted SP carrier, and outputs the generated SP carrier to the complex division section 321. The complex division section 321 divides a signal of the received SP carrier separated by the SP separation section 320 by a signal of the transmitted SP carrier generated by the SP generation section 322. Thus, the complex division section 321 calculates a transmission path coefficient at a position of the received SP carrier, and outputs the calculated transmission path coefficient to the time axis interpolation section 324. The time axis interpolation section 324 performs the time axis interpolation which has been described with reference to FIG. 12, and outputs, to the frequency axis interpolation section 325, the transmission path coefficient at the position of the received SP carrier inputted thereto and transmission path coefficients calculated by means of the time axis interpolation. The frequency axis interpolation section 325 performs the frequency axis interpolation, which has been described with reference to FIG. 12, so as to calculate transmission path coefficients at positions of all subcarriers, and outputs the obtained transmission path coefficients to the complex division section 327. The delay section 326 delays the OFDM signal inputted from the SP separation section 320 and outputs the delayed signal to the complex division section 327. The complex division section 327 performs complex division, respectively, on data carriers of the OFDM signal outputted from the delay section 326 by the transmission path coefficients outputted from the frequency axis interpolation section 325, and outputs the obtained OFDM signal to the error correction section 310. By executing the process described above, the equalization section 309 cancels (compensates for) the distortion of the OFDM signal being transmitted via the transmission path. As described with reference to FIG. 12, however, the equalization section 309 generates an interpolation error due to a gain variation caused by the stepped AGC control when the time axis interpolation is performed.

As described above, in the conventional reception device 300, the equalization section 309 malfunctions due to a discrete amplitude fluctuation caused by the stepped AGC, and thus the reception performance deteriorates.

Patent document 1 discloses a technique which solves the problem mentioned above. FIG. 14 is a diagram illustrating an automatic gain control device 400 disclosed in patent document 1. As shown in FIG. 14, the automatic gain control device 400 includes a gain variable section 401, a gain variable section 402, and an automatic gain variable control section 407. The gain variable section 401 provides an inputted modulated signal with stepped gain variation. The gain variable section 402 provides, with linear gain variation, a signal whose amplitude varies in a stepped manner, which is outputted from the gain variable section 401. The automatic gain variable control section 407 controls the gain variable section 401 and the gain variable section 402 so as to maintain an amplitude of the signal outputted from the gain variable section 402 at a constant.

FIG. 15 is a diagram describing amplitudes and gains of input and output signals of the gain variable section 401 and the gain variable section 402. FIG. 15($a$) shows the amplitude of a signal inputted to the gain variable section 401. FIG. 15($b$) shows a steppedly-varied gain with which the gain variable section 401 provides the signal inputted thereto. FIG. 15($c$) shows the amplitude of the signal outputted from the gain variable section 401. FIG. 15($d$) shows a linearly-varied gain with which the gain variable section 402 provides the signal inputted thereto. FIG. 15($e$) shows the amplitude of the signal outputted from the gain variable section 402. For example, if the amplitude of a signal inputted to the gain variable section 401 gradually decreases (see (a)), the gain variable section 401 provides the inputted signal with a steppedly-varied gain (see (b)). As a result, the gain variable section 401 outputs a signal whose amplitude varies discretely (see (c)). In response to an instruction from the automatic gain variable control section 407, the gain variable section 402 provides a linearly-varied gain with an output signal of the gain variable section 401 so as to maintain an amplitude of the signal at a constant (see (d)). As a result, the gain variable section 402 is able to output a signal whose amplitude is maintained constant (see (e)).

As described above, the automatic gain control device 400 is able to maintain the amplitude of a signal outputted from the gain variable amplifier at a constant even when the stepped AGC is performed. Thus, by utilizing the automatic gain control device 400 in the gain variable amplifier of the tuner 302 included in the reception device 300 (see FIG. 8), it may be possible not to cause the equalization section 309 to malfunction due to the discrete amplitude fluctuation caused by the stepped AGC.

[Patent document 1] Japanese Laid-Open Patent Publication No. 2006-74702

DISCLOSURE OF THE INVENTION

Problems to be Solved by the Invention

In the case where the automatic gain control device 400 is utilized in the reception device 300 as described above, however, the following problem occurs. FIG. 16 is a diagram describing a setting of a time constant of the gain variable section 402. FIGS. 16($a$) to ($e$) are the same images as those of FIGS. 15($a$) to ($e$), respectively, and in FIGS. 16($a$) to ($e$), a time constant of the gain variable section 402 is set at an appropriate value.

FIGS. 16($d$-1) and ($e$-1) show a gain of the gain variable section 402 and an amplitude of an output signal of the gain variable section 402, respectively, in the case where a time constant of the gain variable section 402 is set at a high value. As shown in FIG. 16($d$-1), when the time constant of the gain variable section 402 is set at a high value, the gain of the gain variable section 402 excessively rises. Then, the gain of the gain variable section 402 fluctuates up and down in an inappropriate manner (overshoots). As a result, as shown in FIG. 16($e$-1), the amplitude of an output signal of the gain variable section 402 accordingly varies in a wavy manner, and such a situation is undesirable.

FIGS. 16($d$-2) and ($e$-2) show a gain of the gain variable section 402 and an amplitude of an output signal of the gain variable section 402, respectively, in the case where a time constant of the gain variable section 402 is set at a low value. As shown in FIG. 16($d$-2), when the time constant of the gain variable section 402 is set at a low value, the gain variable section 402 cannot obtain a required gain. Accordingly, as shown in FIG. 16($e$-2), the amplitude of an output signal of the gain variable section 402 gradually decreases. That is, when the time constant of the gain variable section 402 is set at a low value, the AGC does not function at all.

As described above, in the case where the automatic gain control device 400 is utilized in the reception device 300, it is possible to prevent the reception performance from deteriorating as a result of the equalization section 309 which malfunctions due to the discrete amplitude fluctuation caused by the stepped AGC. However, a time constant of the gain variable section 402 needs to be precisely set, and thus the above case is undesirable.

Therefore, an object of the present invention is to provide an OFDM-modulated digital broadcasting reception device capable of preventing the reception performance from deteriorating as a result of an equalization section which malfunctions due to discrete amplitude fluctuation caused by the stepped AGC, without utilizing the automatic gain control device 400.

Solution to the Problems

The present invention is directed to a reception device for receiving an OFDM signal whose level is maintained constant by performing an AGC control which adjusts an amplification gain by means of a discrete gain value. In order to attain the object mentioned above, the reception device of the present invention comprises: a variable gain amplifier operable to amplify the OFDM signal based on the amplification gain varied in accordance with an AGC control signal; a level detection section operable to detect a level of the amplified OFDM signal and to generate the AGC control signal which provides the variable gain amplifier with the amplification gain in order to maintain the detected level at a constant; an FFT section operable to perform a fast Fourier transform in a portion of the amplified OFDM signal; a timing control section operable to output the AGC control signal to the variable gain amplifier at a timing of varying the amplification gain of the OFDM signal in other portions of the OFDM signal on which no fast Fourier transform is performed; and an equalization section operable to execute an equalization process of detecting, respectively, distortions of a plurality of reference subcarriers regularly included in the OFDM signal on which the fast Fourier transform has been performed, and of estimating, by means of an interpolation using the detected distortions, a distortion of an OFDM signal, which distortion is caused by transmission path propagation so as to correct the estimated distortion of the OFDM signal, wherein the equalization section corrects, by using the AGC control signal, an estimated error of the distortion of the OFDM signal, which distortion is caused by a discrete amplification gain variation of the OFDM signal.

Preferably, the equalization section includes: among a plurality of symbols constituting the OFDM signal, a transmission path coefficient correction section operable to calculate, by using the AGC control signal, a correction coefficient indicating a difference between a level of the AGC control signal corresponding to a symbol on which the equalization process is to be executed and a level of the AGC control signal corresponding to a symbol used for the equalization process, a time axis interpolation section operable to, by performing a time axis interpolation on a portion of a plurality of subcarriers included in the symbol on which the equalization process is to be executed, using the distortions of the reference subcarriers included in the symbol used for the equalization process, the time axis interpolation canceling an interpolation error generated by the discrete gain variation of the OFDM signal in accordance with the correction coefficient, estimate a portion of distortions of the plurality of subcarriers included in the symbol on which the equalization process is to be executed, which distortions are caused by the transmission path propagation; a frequency axis interpolation section operable to, by performing a frequency axis interpolation on all of the plurality of subcarriers, using the estimated distortions of the portion of the plurality of subcarriers and the distortions of the reference subcarriers included in the symbol on which the equalization process is to be executed, estimate all the distortions of the plurality of subcarriers included in the symbol on which the equalization process is to be executed, which distortions are caused by the transmission path propagation; and a complex division section operable to divide all of the plurality of subcarriers included in the symbol on which the equalization process is to be executed by all the estimated distortions of the plurality of subcarriers.

Preferably, the timing control section further detects the AGC control signal in which a phase variation of the OFDM signal to be amplified exceeds a predetermined threshold value, and the equalization section includes: among a plurality of symbols constituting the OFDM signal, a transmission path coefficient correction section operable to calculate, by using the AGC control signal, a correction coefficient indicating a difference between a level of the AGC control signal corresponding to a symbol on which the equalization process is to be executed and a level of the AGC control signal corresponding to a symbol used for the equalization process; a time axis interpolation section operable to, by performing a time axis interpolation on a portion of a plurality of subcarriers included in the symbol on which the equalization process is to be executed, using the distortions of the reference subcarriers included in the symbol used for the equalization process, the time axis interpolation canceling an interpolation error generated by the discrete gain variation of the OFDM signal in accordance with the correction coefficient, estimate a portion of distortions of the plurality of subcarriers included in the symbol on which the equalization process is to be executed, which distortions are caused by the transmission path propagation; a switch operable to input the portion of the distortions of the plurality of subcarriers, which distortions are estimated by the time axis interpolation, and operable to output the portion of the distortions only for a period during which the timing control section does not detect the AGC control signal in which the phase variation of the OFDM signal exceeds the predetermined threshold value; a frequency axis interpolation section operable to, by performing a frequency axis interpolation on all of the plurality of subcarriers, using, for a period during which the switch outputs the portion of the distortions, the estimated distortions of the portion of the plurality of subcarriers and the distortions of the reference subcarriers included in the symbol on which the equalization process is to be executed, and using, for a period during which the switch does not output the portion of the distortions, the distortions of the reference subcarriers included in the symbol on which the equalization process is to be executed, estimate all the distortions of the plurality of subcarriers included in the symbol on which the equalization process is to be executed, which distortions are caused by the transmission path propagation; and a complex division section operable to divide all of the plurality of subcarriers included in the symbol on which the equalization process is to be executed by all the estimated distortions of the plurality of subcarriers.

Furthermore, the present invention is also directed to a reception method of receiving an OFDM signal whose level is maintained constant by performing an AGC control which adjusts an amplification gain by means of a discrete gain value. In order to attain the object mentioned above, the reception method of the present invention comprises the steps of: amplifying the OFDM signal based on the amplification gain varied in accordance with an AGC control signal; detecting a level of the amplified OFDM signal and generating a new AGC control signal which maintains the detected level at a constant; performing a fast Fourier transform in a portion of the amplified OFDM signal; changing, at a timing of varying the amplification gain of the OFDM signal in other portions of the OFDM signal on which no fast Fourier transform is performed, the AGC control signal to the new AGC control signal; and executing an equalization process of detecting, respectively, distortions of a plurality of reference subcarriers regularly included in the OFDM signal on which the fast Fourier transform has been performed, and of estimating, by means of an interpolation using the detected distortions, a distortion of the OFDM signal, which distortion is caused by transmission path propagation so as to correct the estimated distortion of the OFDM signal, wherein in the step of executing the equalization process, an estimated error of the distortion of the OFDM signal, which distortion is caused by a discrete amplification gain variation of the OFDM signal, is corrected by using the AGC control signal.

Furthermore, the present invention is also directed to an integrated circuit integrated into a reception device for receiving an OFDM signal whose level is maintained constant by performing an AGC control which adjusts an amplification gain by means of a discrete gain value. In order to attain the problem mentioned above, the integrated circuit executes functions as: a variable gain amplifier operable to amplify the OFDM signal based on the amplification gain varied in accordance with an AGC control signal; a level detection section operable to detect a level of the amplified OFDM signal and to generate the AGC control signal which provides the variable gain amplifier with the amplification gain in order to maintain the detected level at a constant; an FFT section operable to perform a fast Fourier transform in a portion of the amplified OFDM signal; a timing control section operable to output the AGC control signal to the variable gain amplifier at a timing of varying the amplification gain of the OFDM signal in other portions of the OFDM signal on which no fast Fourier transform is performed; and an equalization section operable to execute an equalization process of detecting, respectively, distortions of a plurality of reference subcarriers regularly included in the OFDM signal on which the fast Fourier transform has been performed, and of estimating, by means of an interpolation using the detected distortions, a distortion of the OFDM signal, which distortion is caused by transmission path propagation, and for correcting, by using the AGC control signal, an estimated error of the distortion of the OFDM signal, which distortion is caused by a discrete amplification gain variation of the OFDM signal.

Effect of the Invention

As described above, according to the present invention, it becomes possible to provide an OFDM-modulated digital broadcasting reception device capable of preventing a reception performance from deteriorating as a result of an equalization section which malfunctions due to the discrete gain fluctuation caused by the stepped AGC.

Figure 1:
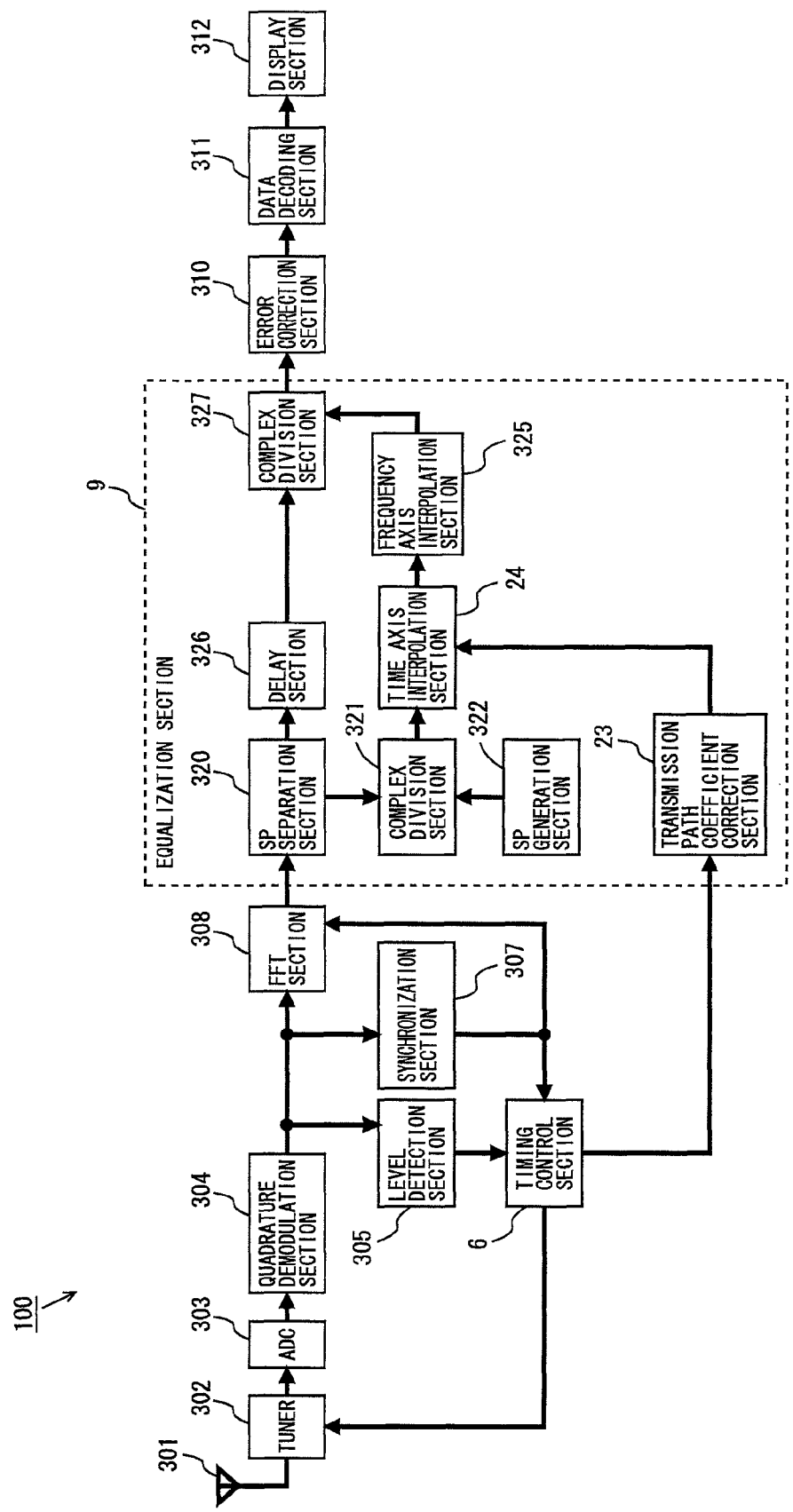
FIG. 1 is a diagram illustrating an exemplary structure of an OFDM-modulated digital broadcasting reception device 100 according to a first embodiment of the present invention.

DESCRIPTION OF THE REFERENCE CHARACTERS 6, 60, 306 timing control section
9, 90, 309 equalization section
23 transmission path coefficient correction section
24, 324 time axis interpolation section
50 SW
100, 200, 300 reception device
301 antenna
302 tuner
303 ADC
304 quadrature demodulation section
305 level detection section
307 synchronization section
308 FFT section
309 equalization section
310 error correction section
311 data decoding section
312 display section
320 SP separation section
321, 327 complex division section
322 SP generation section
325 frequency axis interpolation section
326 delay section
330 electric power calculation section
331 logarithmic conversion section
332 subtraction section
333 reference value generation section
334 loop filter section
335 quantization section
400 automatic gain control device
401, 402 gain variable section
407 automatic gain variable control section

BEST MODE FOR CARRYING OUT THE INVENTION

First Embodiment

Figure 13:
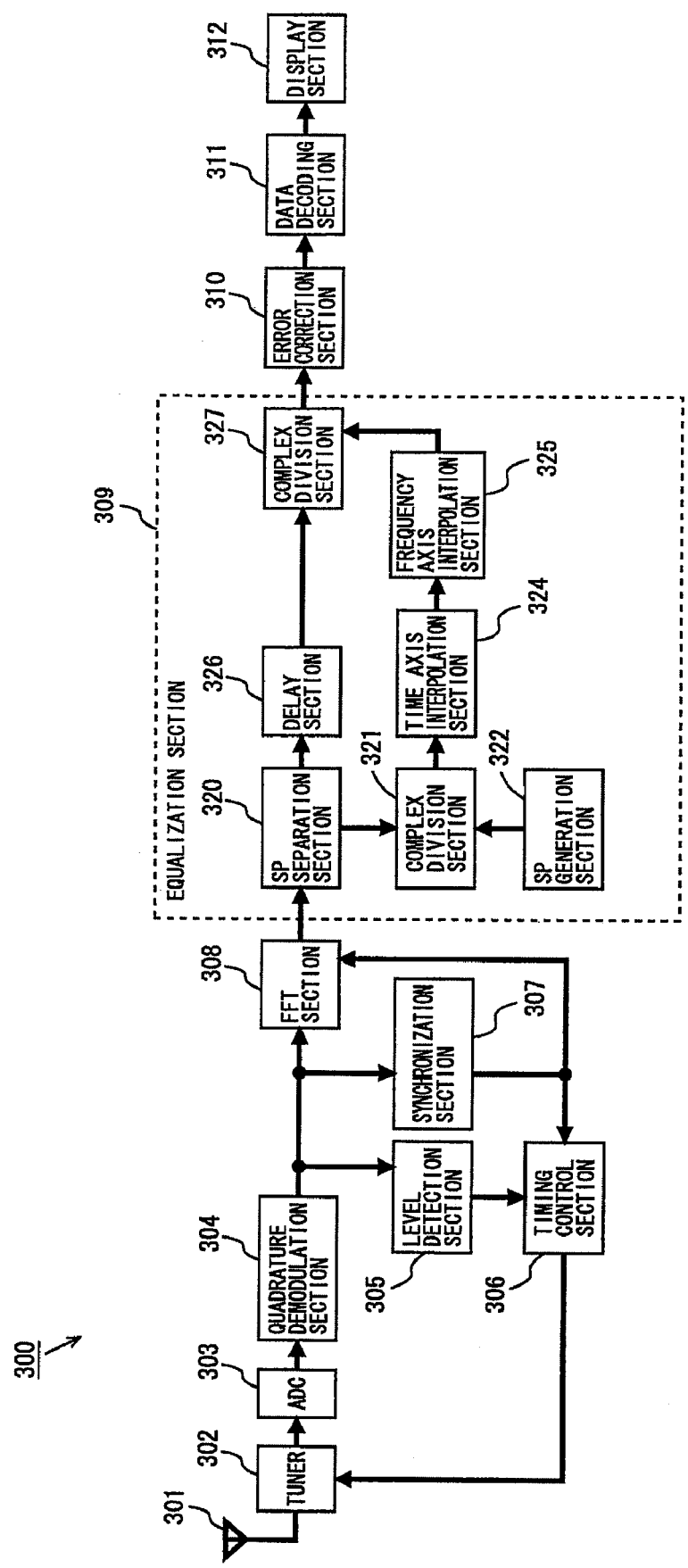
FIG. 13 is a diagram describing a structure of the equalization section 309 included in the reception device 300.
Figure 14:
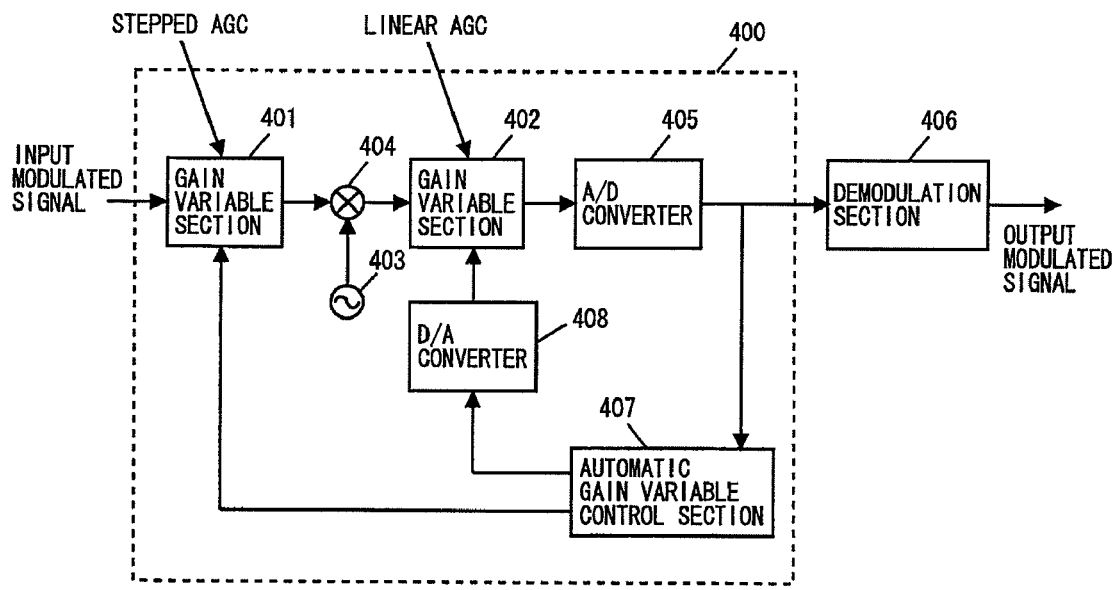
FIG. 14 is a diagram illustrating an automatic gain control device 400 disclosed in patent document 1.
Figure 15:
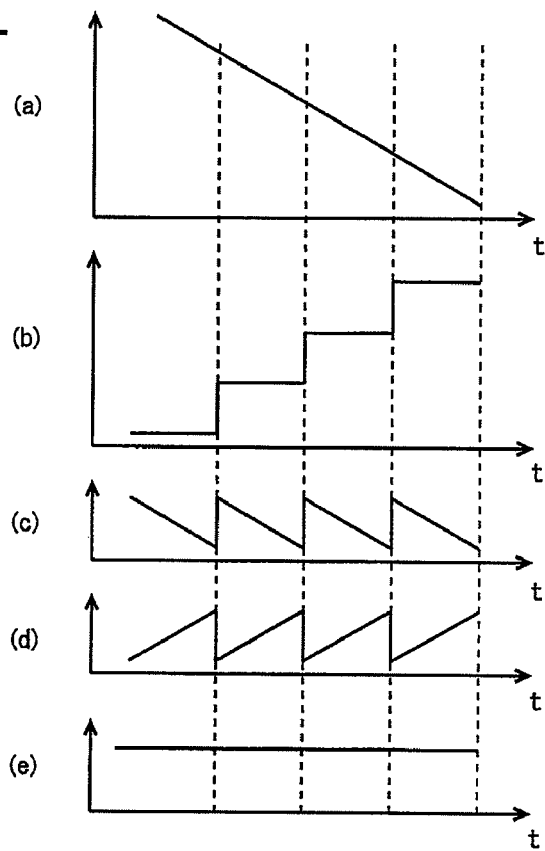
FIG. 15 is a diagram describing amplitudes and gains of input and output signals of a gain variable section 401 and a gain variable section 402.
Figure 16:
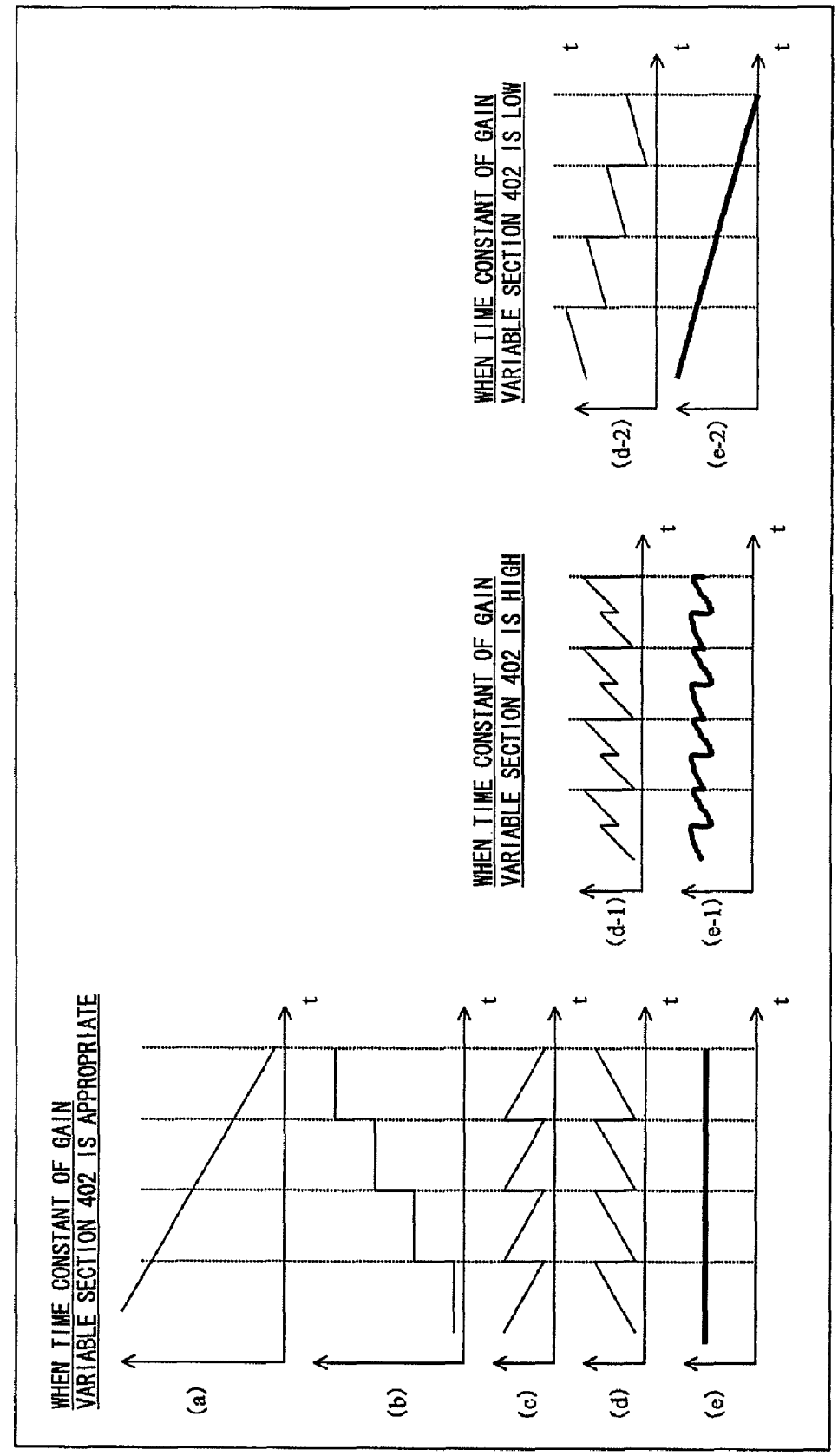
FIG. 16 is a diagram illustrating a setting of a time constant of the gain variable section 402.

FIG. 1 is a diagram illustrating an exemplary structure of an OFDM-modulated digital broadcasting reception device 100 according to a first embodiment of the present invention. As shown in FIG. 1, the structure of the OFDM-modulated digital broadcasting reception device 100 (hereinafter referred to as the reception device 100) is basically the same as that of the conventional reception device 300 shown in FIG. 13 in that the timing control section 306 and the equalization section 309 are replaced with a timing control section 6 and an equalization section 9, respectively. A structure of the equalization section 9 is basically the same as that of the equalization section 309 in that a transmission path coefficient correction section 23 is additionally provided and the time axis interpolation section 324 is replaced with a time axis interpolation section 24. Note that the same components of the reception device 100 as those of the conventional reception device 300 will be denoted by the same reference numerals and will not be further described below.

Figure 9:
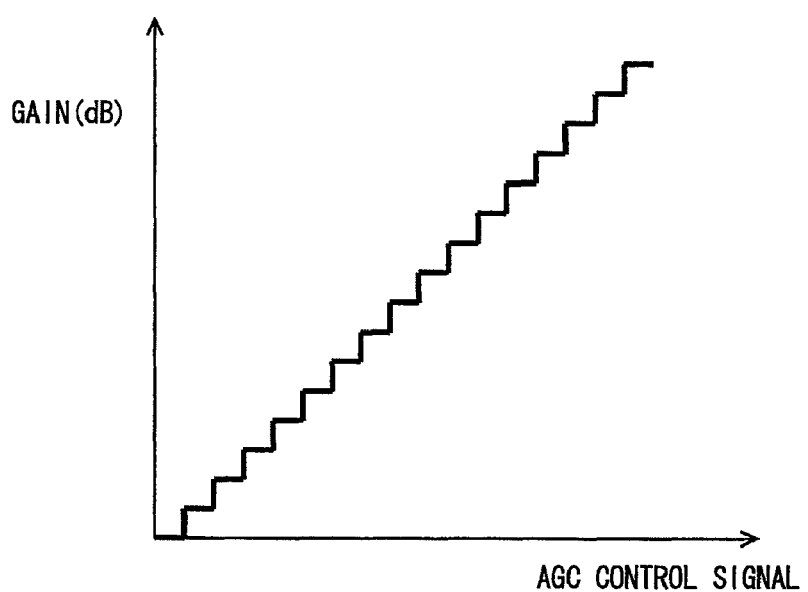
FIG. 9 is a diagram illustrating a relationship between the control signal and the gain of the gain variable amplifier included in the tuner 302.
Figure 10:
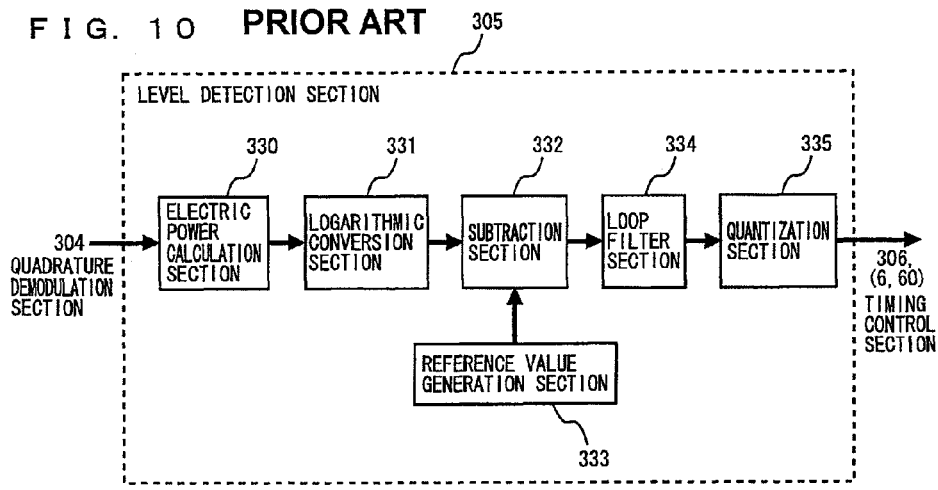
FIG. 10 is a diagram illustrating an exemplary structure of a level detection section 305.
Figure 11:
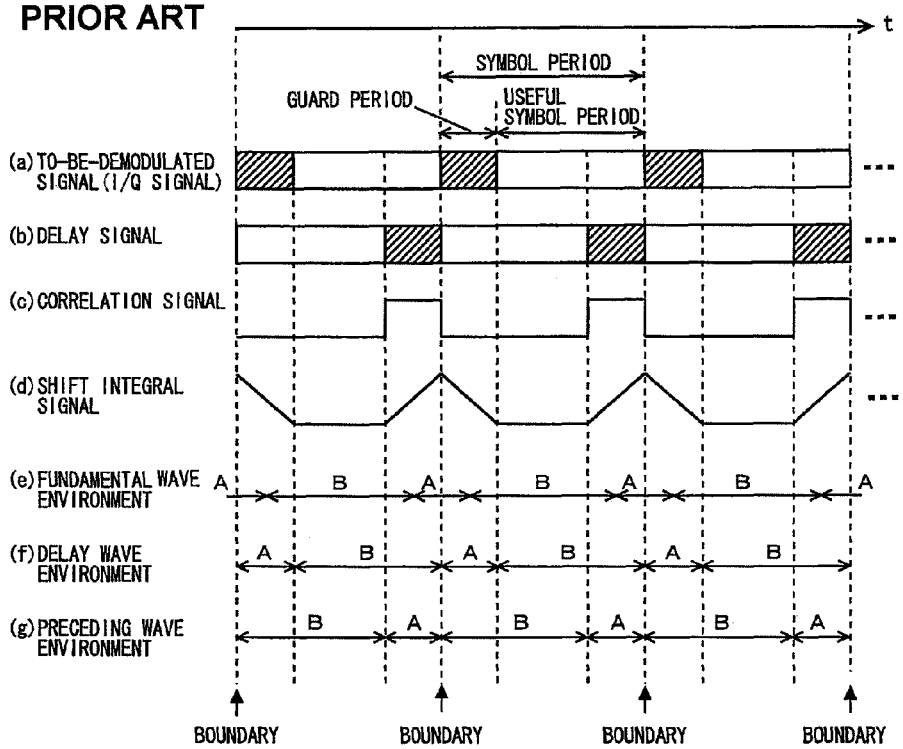
FIG. 11 is a diagram describing an operation of a synchronization section 307.

Hereinafter, an operation of the reception device 100 will be described. The antenna 301 receives an OFDM modulated signal so as to output the received OFDM modulated signal to the tuner 302. The tuner 302 selects a signal having a desired channel from the inputted OFDM modulated signal, converts the selected signal into a predetermined intermediate frequency signal so as to amplify the converted intermediate frequency signal, and finally outputs the signal thus obtained to the ADC 303. Note that the tuner 302 includes a gain variable amplifier for amplifying an intermediate frequency signal. A gain of the gain variable amplifier included in the tuner 302 discretely varies because a control signal having a discrete value generated by digital signal processing (an AGC control signal) is inputted to the gain variable amplifier (see FIG. 9). Furthermore, the gain of the gain variable amplifier is increased in increments of 1 dB, for example, so as to correspond to a minimum increment of the control signal. The ADC 303 converts the inputted intermediate frequency signal into a digital signal from an analog signal, and outputs the converted signal to the quadrature demodulation section 304. The quadrature demodulation section 304 performs orthogonal detection on the inputted intermediate frequency signal so as to be converted into an I/Q signal, and outputs the I/Q signal thus obtained to the level detection section 305, the synchronization section 307 and the FFT section 308. The level detection section 305 detects a difference between an electric power level of the inputted I/Q signal and a desired electric power level, and generates an AGC control signal, which is a control signal to be inputted to the gain variable amplifier of the tuner 302 (see FIG. 10). The synchronization section 307 detects an FFT window position at which the FFT is performed by using a correlation with respect to a guard period of the inputted I/Q signal (see FIG. 11), and notifies the FFT section 308 and the timing control section 6 of the detected FFT window position. The FFT section 308 performs the FFT at the notified FFT window position of the I/Q signal so as to convert the I/Q signal into a signal in a frequency range, and outputs the obtained signal to the equalization section 9.

Similarly to the timing control section 306 (see FIG. 13), the timing control section 6 calculates the timing (the period A of FIG. 11) at which a stepped AGC control signal is to be outputted to the tuner 302 by using the information on the notified FFT window position, and outputs the stepped AGC control signal inputted from the level detection section 305 to the tuner 302 at the timing having been calculated. The gain variable amplifier of the tuner 302 varies the gain in accordance with the stepped AGC control signal inputted thereto. Furthermore, the timing control section 6 outputs the inputted AGC control signal to the equalization section 9.

Figure 12:
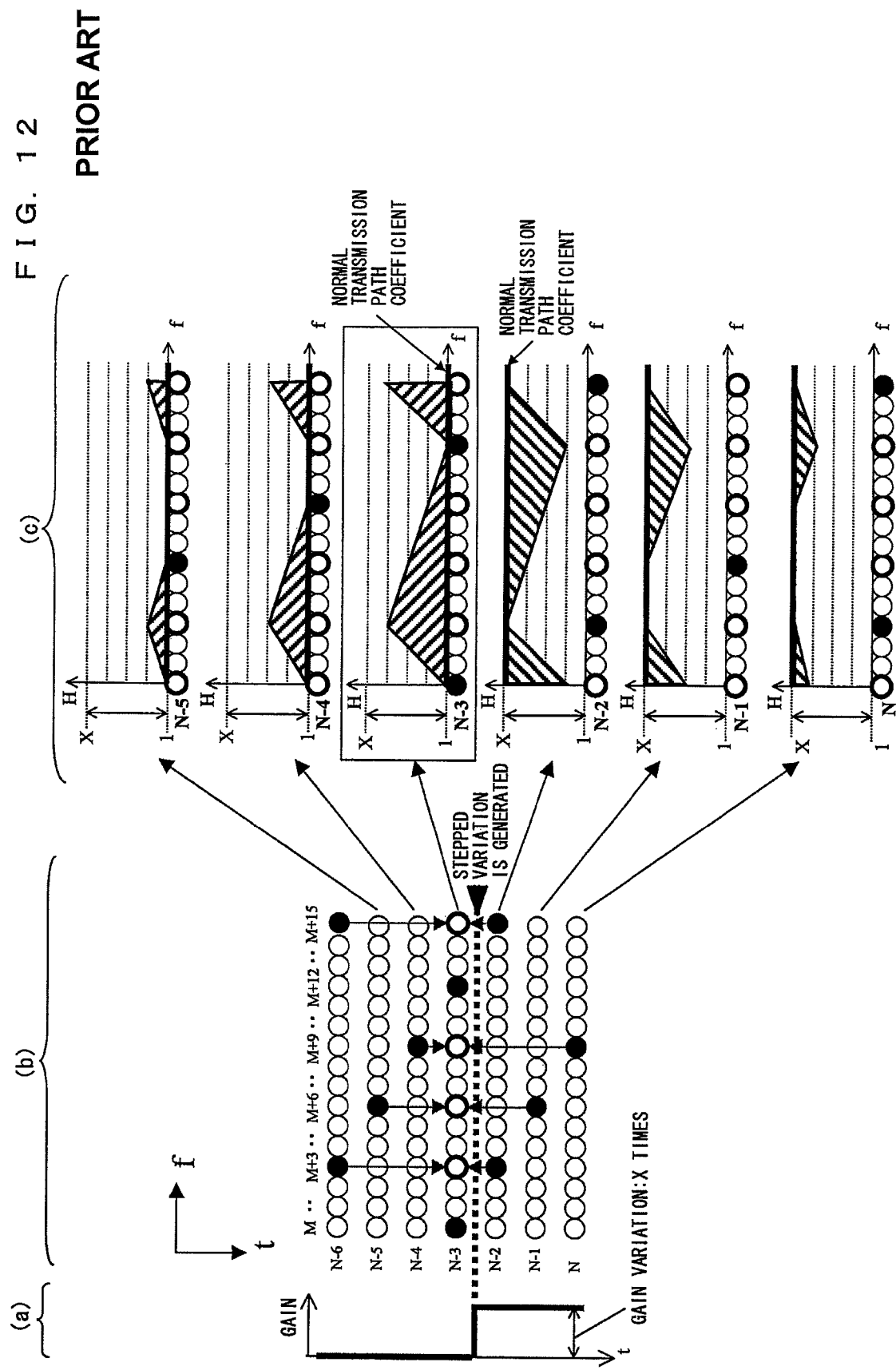
FIG. 12 is a diagram describing an equalization process executed by an equalization section 309.

Similarly to the equalization section 309, the equalization section 9 executes an equalization process by performing time axis interpolation and frequency axis interpolation on the inputted I/Q signal in a frequency range, and then outputs the obtained signal to the error correction section 310. When the equalization process is executed, the equalization section 9 corrects, by using the AGC control signal inputted from the timing control section 6, an interpolation error (see FIG. 12(c)) to be generated when the equalization section 309 executes the equalization process.

The error correction section 310 executes the error correction process on the I/Q signal in which the transmission path distortion has been averaged, and outputs the signal thus obtained to the data decoding section 311. The data decoding section 311 executes a predetermined video and audio data decompression process on the TS signal inputted thereto, and outputs the TS signal on which the aforementioned processes have been executed to the display section 312. By using the inputted signal, the display section 312 provides the user with services relating to video or the like.

Hereinafter, an operation of the equalization section 9 will be described in detail with reference to FIG. 1. To the SP separation section 320, an OFDM signal in a frequency area is inputted from the FFT section 308. The SP separation section 320 separates a SP carrier of the OFDM signal therefrom and outputs the SP carrier to the complex division section 321, and then outputs, to the delay section 326, the OFDM signal from which the SP carrier has been separated. The SP generation section 322 generates a SP carrier having an amplitude and a phase, both of which being synchronized with those of the transmitted SP carrier, and outputs the generated SP carrier to the complex division section 321. The complex division section 321 divides a signal of the received SP carrier separated by the SP separation section 320 by a signal of the transmitted SP carrier generated by the SP generation section 322. Thus, the complex division section 321 calculates a transmission path coefficient at a position of the received SP carrier, and outputs the calculated transmission path coefficient to the time axis interpolation section 24.

To the transmission path coefficient correction section 23, an AGC control signal is inputted from the timing control section 6. The transmission path coefficient section 23 calculates a correction coefficient for correcting the transmission path coefficient inputted from the time axis interpolation section 24, and then outputs the calculated correction coefficient to the time axis interpolation section 24. The time axis interpolation section 24 performs the time axis interpolation using the transmission path coefficient at a position of the received SP carrier inputted from the complex division section 321, thereby calculating transmission path coefficients at positions of predetermined subcarriers (see FIG. 12(b)). When performing the time axis interpolation, the time axis interpolation section 24 corrects an interpolation error (see FIG. 12(c)) by using the correction coefficient inputted from the transmission path coefficient correction section 23. Then, the time axis interpolation section 24 outputs, to the frequency axis interpolation section 325, the transmission path coefficient at the position of the received SP carrier inputted thereto and the transmission path coefficients calculated by means of the time axis interpolation. The frequency axis interpolation section 325 performs the frequency axis interpolation so as to calculate transmission path coefficients at positions of all subcarriers, and outputs the obtained transmission path coefficients to the complex division section 327. The delay section 326 delays the OFDM signal inputted from the SP separation section 320 by a period required for the correction process, and outputs the delayed signal to the complex division section 327. The complex division section 327 performs complex division, respectively, on data carriers of the OFDM signal outputted from the delay section 326 by the transmission path coefficients outputted from the frequency axis interpolation section 325, and outputs the obtained OFDM signal to the error correction section 310.

Figure 2:
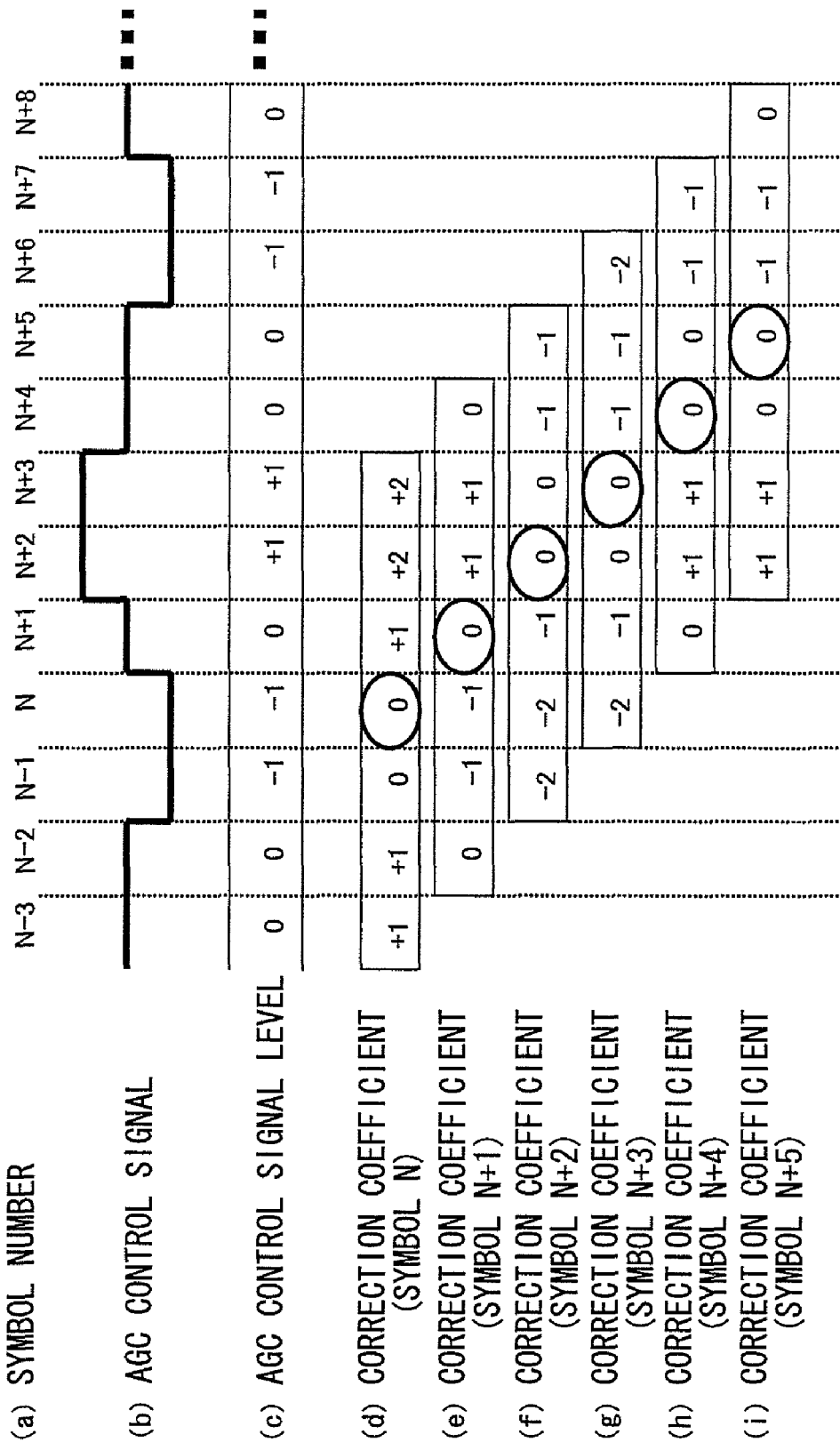
FIG. 2 is a diagram describing an operation of a transmission path coefficient correction section 23.

FIG. 2 is a diagram describing an operation of the transmission path coefficient correction section 23. FIG. 2(a) indicates a symbol number of a received OFDM signal. FIG. 2(b) represents an AGC control signal to be inputted to the transmission path coefficient correction section 23 from the timing control section 6. Note that the timing control section 6 executes a delay process such that the AGC control signal, shown in FIG. 2(b), to be inputted to the transmission path coefficient correction section 23 becomes equal to an AGC control signal used when each symbol shown in FIG. 2(a) is amplified. FIG. 2(c) indicates, when a level of an AGC control signal corresponding to the N−3th symbol is "0" as a reference value, a level of an AGC control signal corresponding to each symbol. FIG. 2(d) indicates a correction coefficient for correcting a transmission path coefficient to be used when the time axis interpolation is performed on the Nth symbol. The correction coefficient of FIG. 2(d) is obtained by offsetting each level of the AGC control signal of FIG. 2(c) so as to cause a level of the Nth symbol on which the time axis interpolation is performed to become "0". FIG. 2(e) indicates a correction coefficient for correcting a transmission path coefficient to be used when the time axis interpolation is performed on the N+1th symbol. The correction coefficient of FIG. 2(e) is obtained by offsetting each level of the AGC control signal of FIG. 2(c) so as to cause a level of the N+1th symbol on which the time axis interpolation is performed to become "0". Similarly to the above, correction coefficients obtained when the time axis interpolation is performed on the N+2th to N+5th symbols, are indicated in FIG. 2(f) to (i), respectively.

To the transmission path coefficient correction section 23, the AGC control signal shown in FIG. 2(b) is inputted from the timing control section 6. Then, the transmission path coefficient correction section 23 calculates a level of the AGC control signal shown in FIG. 2(c) by using the AGC control signal of FIG. 2(b). Thereafter, the transmission path coefficient correction section 23 offsets the level of the AGC control signal shown in FIG. 2(c) so as to calculate the correction coefficients of FIGS. 2(d) to (i), and outputs the calculated correction coefficients to the time axis interpolation section 24 (see FIG. 1).

Next, an operation of the time axis interpolation section 24 will be described in detail. Note that the present embodiment illustrates, as an example, a case where the time axis interpolation is performed on the N+1th symbol using the correction coefficients of FIG. 2(e). Furthermore, in the present embodiment, a transmission path coefficient will be also defined as H (N, M) in a similar manner as already described with reference to FIG. 12, but will be denoted as H (N), omitting "M" which indicates a position of a subcarrier.

Note that a gain of the variable gain amplifier included in the tuner 302 is multiplied by X when a variation amount of an AGC control signal is "+1", while a gain of the variable gain amplifier is multiplied by 1/X when the variation amount of the AGC control signal is "−1". In this case, as is clear from the above description in the background art (see the formula 2), a transmission path coefficient to be used for the interpolation is multiplied by X, 1/X or the like when the time axis interpolation is performed, thereby generating an interpolation error. Thus, in the case where an interpolation error is generated because a transmission path coefficient used for the interpolation is multiplied by X, for example, X is multiplied by 1/X as an inverse thereof, thereby canceling the interpolation error. Similarly, in the case where an interpolation error is generated since a transmission path coefficient used for the interpolation is multiplied by 1/X, for example, 1/X is multiplied by X as an inverse thereof, thereby canceling the interpolation error. Therefore, when the correction coefficient is "+1" in FIG. 2, the time axis interpolation section 24 cancels an interpolation error by multiplying the correction coefficient by "1/X". Also, when the correction coefficient is "−1" in FIG. 2, the time axis interpolation section 24 cancels an interpolation error by multiplying the correction coefficient by "X".

The time axis interpolation section 24 performs the time axis interpolation on the N+1th symbol of FIG. 2(a) with reference to formulas 3 to 5 taking the correction coefficients of FIG. 2(e) into consideration.

A formula 3 is obtained when the time axis interpolation is performed between the N−2th symbol and the N+2th symbol.

$$H(N+1)=(¼)*H(N-2)+(¾)*[H(N+2)*X]*(1/X)$$ [Formula 3]

In the formula 3, [H(N+2)*X] including an interpolation error caused by gain variation is multiplied by a value "1/X" corresponding to, among the correction coefficients of FIG. 2(e), a correction coefficient "+1" of a symbol number N+2. As such, the interpolation error is cancelled.

A formula 4 is obtained when the time axis interpolation is performed between the N−1th symbol and N+3th symbol.

$$H(N+1)=(½)*[H(N-2)·(1/X)*]X(½)*[H(N+3)*X]*(1/X)$$ [Formula 4]

Note that in the formula 4, [H(N−1)*(1/X)] including an interpolation error caused by the gain variation is multiplied by a value "X" corresponding to, among the correction coefficients of FIG. 2(e), a correction coefficient "−1" of a symbol number N−1. Furthermore, [H(N+3)*X] including the interpolation error caused by the gain variation is multiplied by a value "1/X" corresponding to, among the correction coefficients of FIG. 2(e), a correction coefficient "+1" of a symbol number N+3. As such, the interpolation error is cancelled.

A formula 5 is obtained when the time axis interpolation is performed between the Nth symbol and the N+4th symbol.

$$H(N+1)=(¾)*[H(N)·(1/X)]*+X+(¼)*[H(N+4)]$$ [Formula 5]

Note that in the formula 5, [H(N)*(1/X)] including the interpolation error caused by the gain variation is multiplied by a value "X" corresponding to a correction coefficient "−1" of a symbol number N among the correction coefficients of FIG. 2(e). As such, the interpolation error is canceled.

As described above, the time axis interpolation section 24 performs the time axis interpolation by using the aforementioned formulas 3 to 5, thereby canceling the interpolation error (see FIG. 12(c)), and then calculating a transmission path coefficient at a position of each subcarrier used when the interpolation is performed on the N+1th symbol (see solid white circles with a heavy outline) of FIG. 12(b)).

Figure 3:
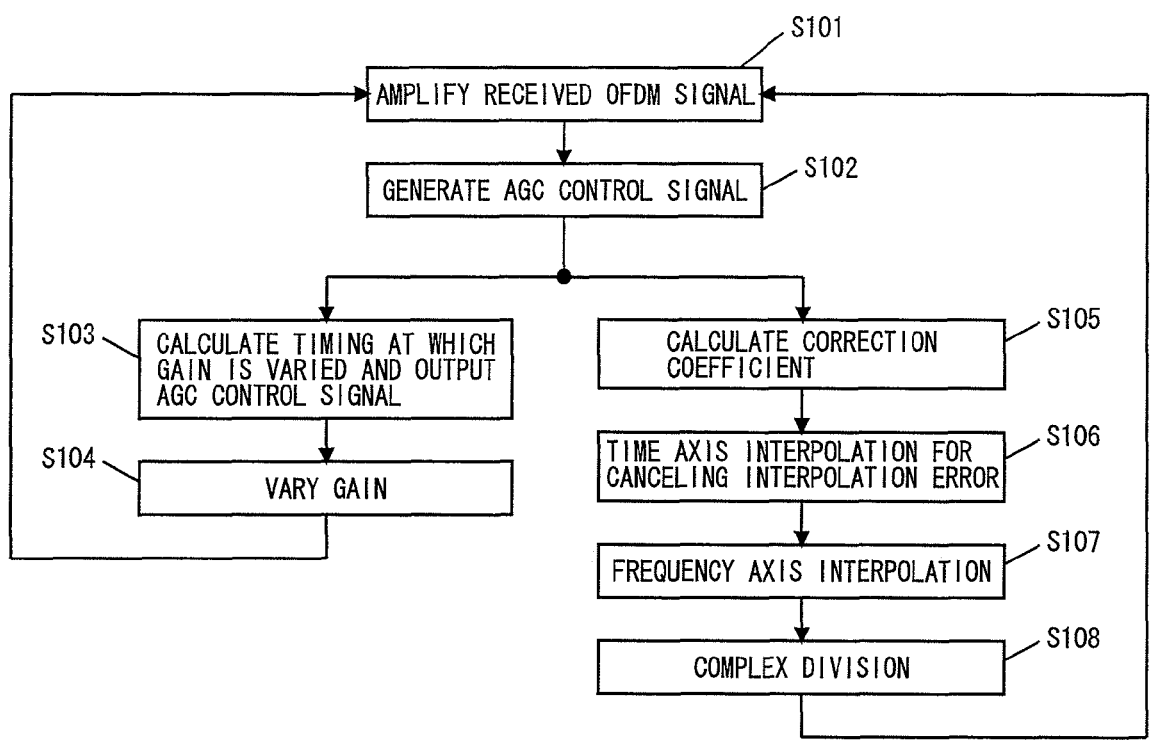
FIG. 3 is a flowchart describing an operation of the reception device 100.

FIG. 3 is a flowchart describing an operation of the reception device 100. Hereinafter, a characteristic operation of the reception device 100 will be described with reference to FIGS. 1 and 3. Firstly, the tuner 302 amplifies a received OFDM signal by means of a gain variable amplifier device (step S101). Then, the level detection section 305 detects a level of the amplified OFDM signal so as to generate an AGC control signal having a value appropriate for an error between the detected level and a target level (step S102). The timing control section 6 calculates a timing at which the gain variable amplifier device of the tuner 302 varies a gain by using information on the FFT window position inputted from the synchronization section 307, and outputs the AGC control signal to the tuner 302 at the timing having been calculated (step S103). Next, the tuner 302 varies the gain of the gain variable amplifier device in a stepped manner in accordance with the AGC control signal inputted from the timing control section 6 (step S104). Then, the tuner 302 amplifies the received OFDM signal based on the gain having been varied (step S101). In the other flowchart path, by using the AGC control signal, the transmission path coefficient correction section 23 included in the equalization section 9 calculates a correction coefficient for canceling an interpolation error of the time axis interpolation, which interpolation error generated by the gain varied in a stepped manner due to the stepped AGC (step S105). Next, based on the correction coefficient inputted from the transmission path coefficient correction section 23, the time axis interpolation section 24 of the equalization section 9 performs the time axis interpolation so as to cancel the interpolation error (step S106). Then, the frequency axis interpolation section 325 included in the equalization section 9 performs a frequency axis interpolation (step S107). A process from steps S105 to S107 is executed, thereby calculating transmission path coefficients for correcting the distortion of the OFDM signal, which distortion is caused by the transmission path fluctuation. Next, the complex division section 327 included in the equalization section 9 executes a complex division process on the OFDM signal to be demodulated by using the transmission path coefficients having been calculated (step S108). By executing the process from steps S105 to S108, the equalization section 9 is able to correct (average) the distortion of the OFDM signal, which distortion is caused by the transmission path fluctuation.

As described above, the reception device 100 according to the first embodiment uses an AGC control signal for performing the stepped AGC in the equalization process of correcting the distortion of the OFDM signal, which distortion is caused by the transmission path fluctuation. Therefore, the reception device 100 is able to execute the equalization process of canceling the interpolation error generated by the gain varied in a stetted manner due to the stepped AGC. As a result, it becomes possible to allow the reception device 100 to prevent the reception performance from deteriorating as a result of the equalization section which malfunctions due to the discrete amplitude fluctuation caused by the stepped AGC, without using the conventional automatic gain control device 400.

Note that the above embodiment illustrates an example where the reception device receives an ISDB-T signal. However, as long as a reception device receives an OFDM signal having a reference signal interposed in a periodic manner and also having a guard period, any type of the reception device may be used. Furthermore, although the above embodiment describes a method of determining the FFT window position by means of the guard correlation, a method of determining, when necessary, an appropriate FFT window position in accordance with a demodulation C/N, a bit error rate or the like may be used. Furthermore, although the above embodiment illustrates an example where a step width of the variable gain amplifier included in the tuner 302 is 1 dB, any values other than 1 dB may also be used. Furthermore, although the above embodiment illustrates an example where the time axis interpolation section 24 performs a leaner interpolation (primary interpolation) within a range of 7 symbols, the time axis interpolation section 24 may perform a higher-order interpolation or may perform an interpolation within a wider range of symbols. Furthermore, in the above embodiment, the transmission path coefficient correction section 23 calculates correction coefficients within a whole range influenced by the stepped AGC. However, the transmission path coefficient correction section 23 may calculate correction coefficients for both symbols immediately preceding and following a point at which a gain is varied by the stepped AGC, the symbols being most influenced by the stepped AGC. Furthermore, either of phase variation or amplitude variation is influenced by the transmission path fluctuation caused by the stepped AGC, the equalization section 6 may use a correction amount represented by a scalar. Alternatively, both of the phase variation and amplitude variation are influenced by the transmission path fluctuation caused by the stepped AGC, the equalization section 9 may use a correction amount represented by a vector.

Second Embodiment

In the reception device 100 according to the first embodiment, an error may be generated in the equalization process executed by the equalization section 9 when a phase of an OFDM signal is significantly varied by the stepped AGC. This is because a phase variation amount is generally large when a gain step width of the gain variable amplifier included in the tuner 302 is also large, and it is difficult to design the gain variable amplifier so as to reduce the deviation of the phase variation amount to a preset value or less.

An OFDM-modulated digital broadcasting reception device 200 (hereinafter referred to as a reception device 200) according to a second embodiment of the present invention does not perform a time axis interpolation when a phase variation is large at a time when the gain is varied by the stepped AGC, thereby avoiding the problem of the reception device 100.

Figure 4:
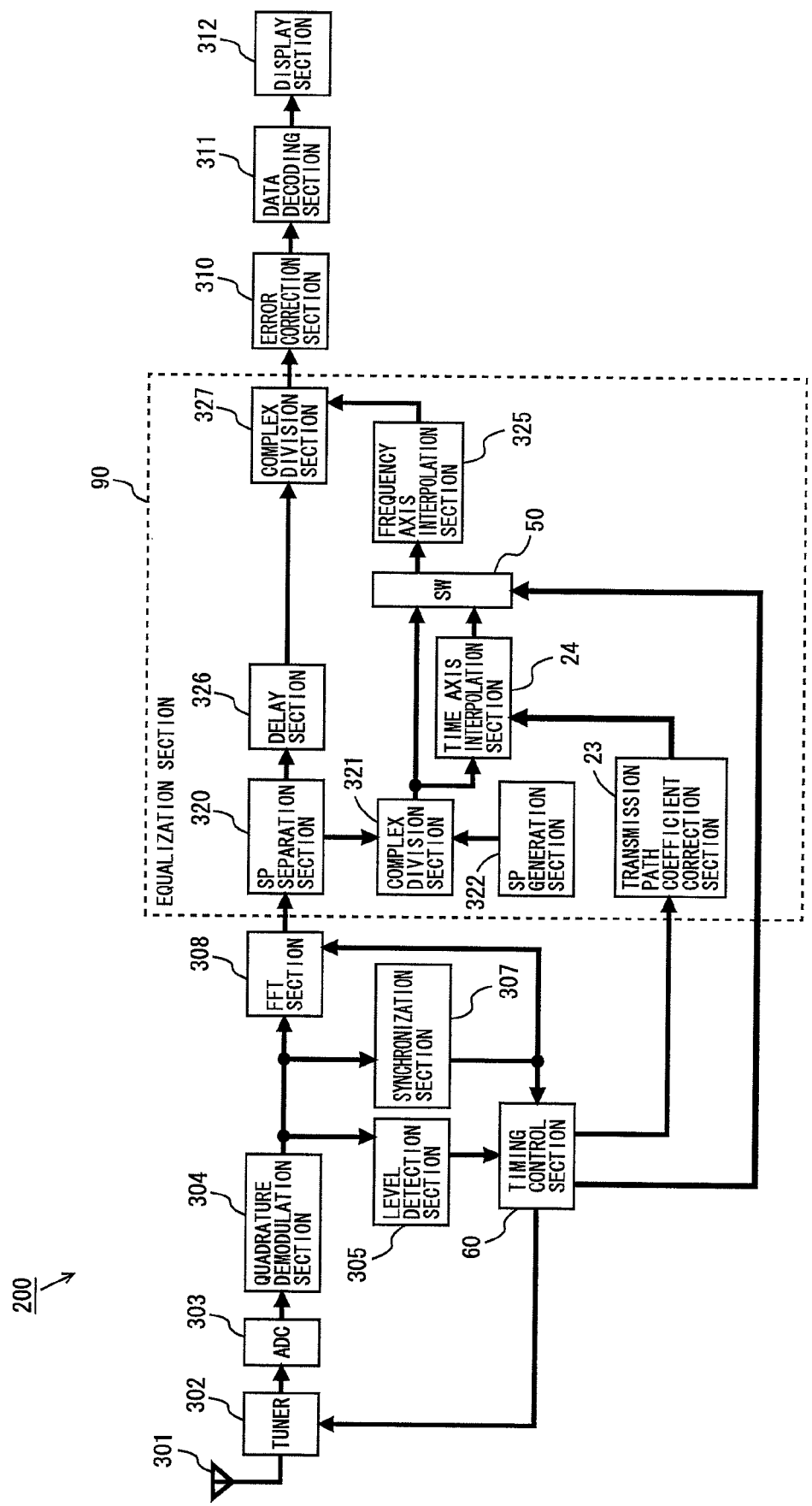
FIG. 4 is a diagram illustrating an exemplary structure of an OFDM-modulated digital broadcasting reception device 200 according to a second embodiment of the present invention.

FIG. 4 is a diagram illustrating an exemplary structure of the OFDM-modulated digital broadcasting reception device 200 according to the second embodiment of the present invention. As shown in FIG. 4, the structure of the reception device 200 is basically the same as that of the reception device 100 shown in FIG. 1 of the first embodiment in that the timing control section 6 and the equalization section 9 are replaced with a timing control section 60 and an equalization section 90, respectively. A structure of the equalization section 90 is basically the same as that of the equalization section 9 in that a switch section (herein after referred to as a SW) 50 is additionally provided. Note that the same components of the reception device 200 as those of the reception device 100 of the first embodiment will be denoted by the same reference numerals and will not be further described below.

Figure 5:
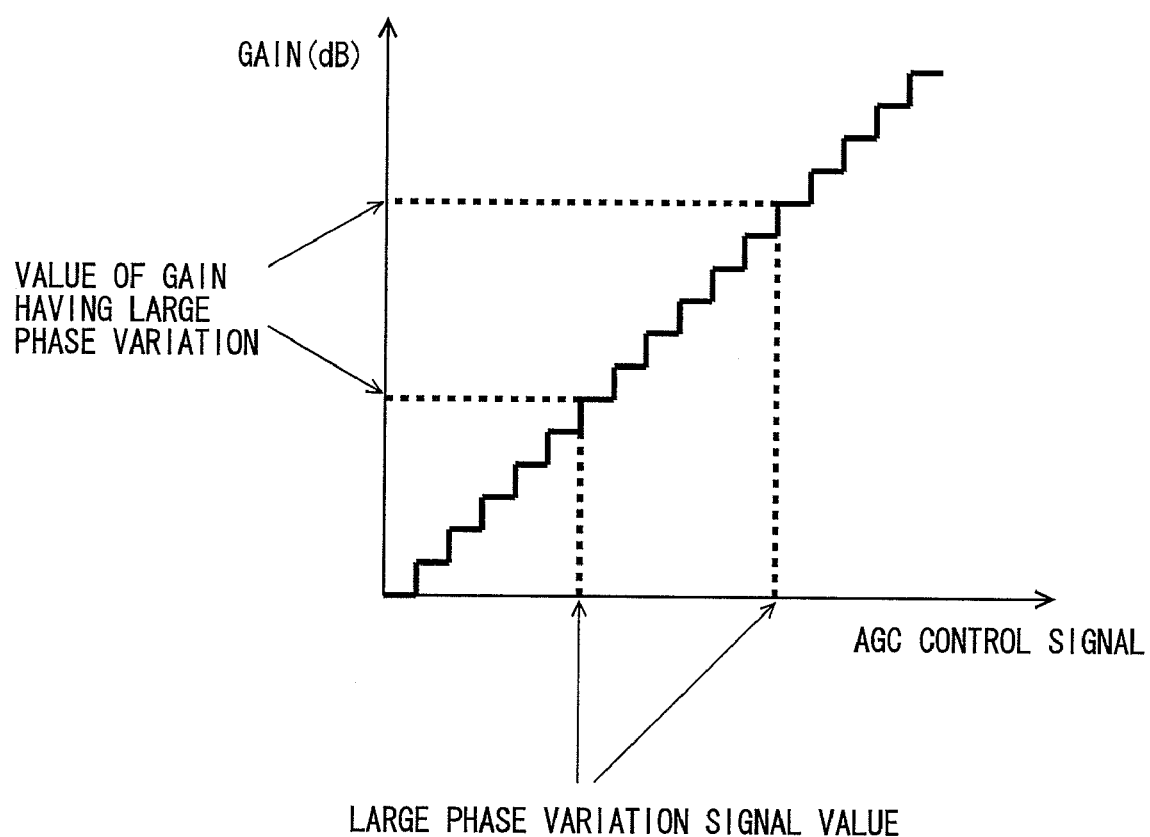
FIG. 5 is a diagram illustrating a relationship between a control signal of a gain variable amplifier included in a tuner 302, a gain and a large phase variation point.

FIG. 5 is a diagram describing a relationship between a control signal of the gain variable amplifier included in the tuner 302, a gain and a large phase variation point. In the above description, the tuner 302 includes one gain variable amplifier for the sake of simplicity. In general, however, the tuner 302 includes a plurality of gain variable amplifiers having gain variation units different from each other (for example, the tuner 302 includes a gain variable amplifier having a gain variation unit of 10 dB and a gain variable amplifier having a gain variation unit of 1 dB). Furthermore, in general, the tuner 302 simultaneously varies amplification gains of the plurality of gain variable amplifiers having the gain variation units different from each other, thereby realizing a gain varied in increments of a preset variation unit (1 dB, for example). Therefore, a gain variable amplifier for varying a gain in increments of a large variation unit does not vary a gain frequently. However, when such a gain variable amplifier varies again, a large phase variation occurs. Thus, as shown by dotted lines of FIG. 5, a value of the AGC control signal corresponding to a value of a gain which causes such a large phase variation (hereinafter referred to as a large phase variation signal value) is specified.

Hereinafter, differences between an operation of the reception device 200 and the operation of the reception device 100 of the first embodiment will be described with reference to FIG. 4. The timing control section 60 performs an operation of the timing control section 6. In addition, the timing control section 60 stores a large phase variation signal value (see FIG. 5). When an AGC control signal having a value equal to the large phase variation signal value is inputted from the level detection section 305, the timing control section 60 determines that a phase variation is large (exceeds a predetermined threshold value), and outputs a notification signal to the SW 50 included in the equalization section 90. That is, the timing control section 60 notifies the SW 50 of a period during which the phase variation of the reception signal exceeds a predetermined threshold value. Note that when outputting the notification signal to the SW 50, the timing control section 60 delays the notification signal by an appropriate amount. To the SW 50, an output signal of the complex division section 321 and an output signal of the time axis interpolation section 24 are inputted, and the SW 50 outputs either of the two output signals to the frequency axis interpolation section 325 in accordance with the notification signal inputted from the timing control section 60. More specifically, the SW 50 outputs the output signal of the complex division section 321 to the frequency axis interpolation section 325 for a period during which the notification signal is inputted from the timing control section 60. On the other hand, the SW 50 outputs the output signal of the time axis interpolation section 24 to the frequency axis interpolation section 325 for a period during which the notification signal is not inputted from the timing control section 60. Thus, the equalization section 90 causes the time axis interpolation section 24 not to perform the time axis interpolation for a period during which a phase variation of the received OFDM signal is large (exceeds a predetermined value). In this case, only the frequency axis interpolation is performed.

Figure 6:
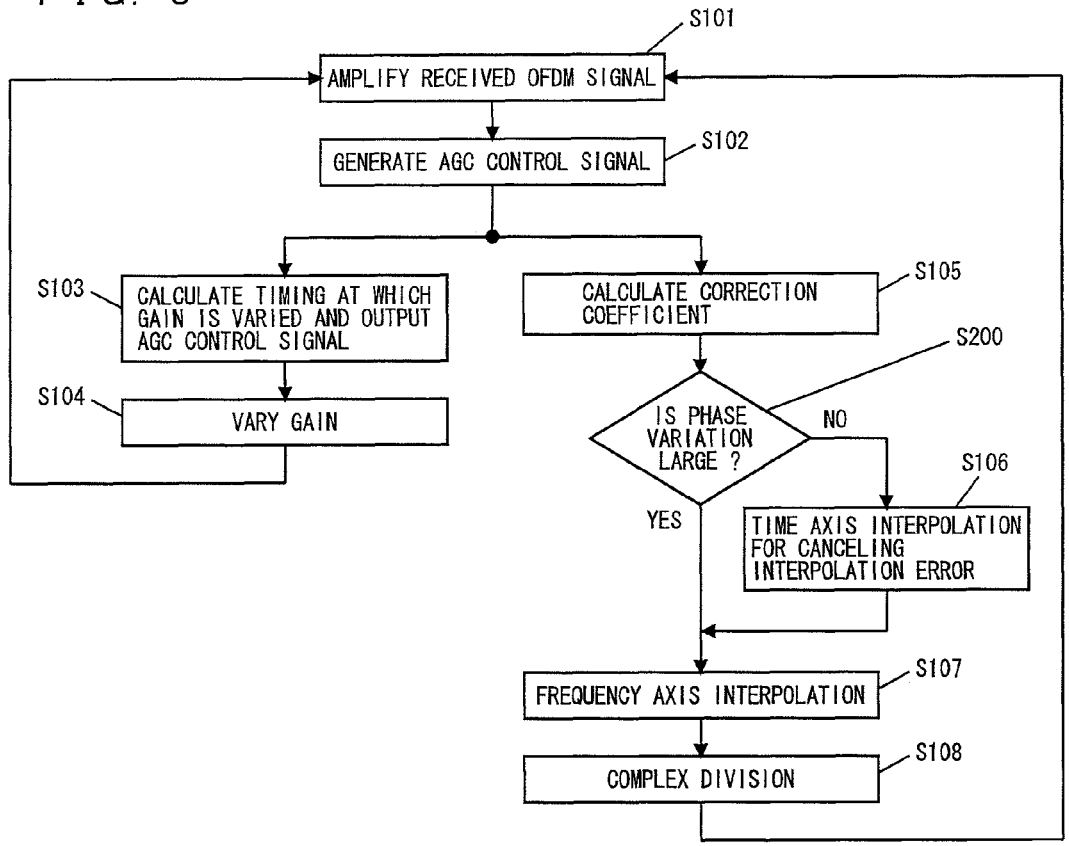
FIG. 6 is a flowchart describing an operation of the reception device 200.

FIG. 6 is a flowchart describing the operation of the reception device 200. The flowchart of FIG. 6 is basically the same as that of FIG. 3 in that step S200 is additionally provided. As shown in FIG. 6, subsequent to step S105, the timing control section 60 determines whether a phase variation of the received OFDM signal is large or not (step S200). When it is determined that the phase variation is large, the time axis interpolation process is omitted and the process proceeds to step S107. On the other hand, when it is determined that the phase variation is not large, the process proceeds to step S106 where the time axis interpolation is to be performed, and then proceeds to step S107.

As described above, in the reception device 200 according to the second embodiment, the equalization section 90 does not perform the time axis interpolation for a period during which a phase of the OFDM signal is significantly varied by the stepped AGC. Thus, while obtaining an effect similar to that of the reception device 100 of the first embodiment to a certain extent, the reception device 200 is further able to eliminate an error of the equalization process, which error is caused by a large phase variation, unlike the reception device 100 of the first embodiment.

Figure 7:
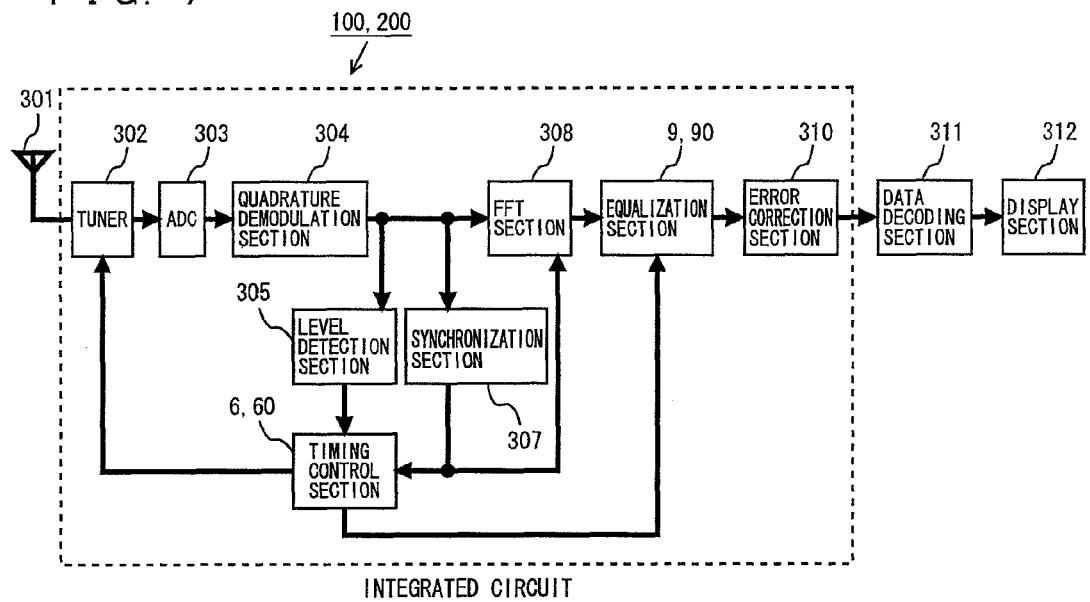
FIG. 7 is a diagram illustrating an exemplary range in which components included in the reception devices 100 of the first embodiment and the reception device 200 of the second embodiment are implemented as integrated circuits.
Figure 8:
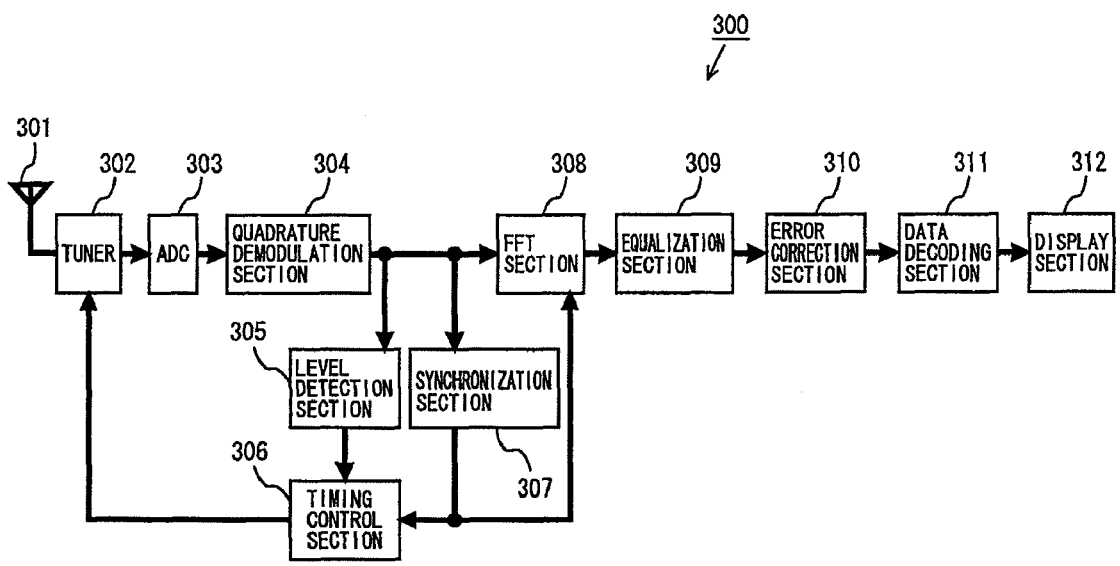
FIG. 8 is a diagram illustrating an exemplary structure of a conventional OFDM-modulated digital broadcasting reception device 300 that performs a stepped AGC.

FIG. 7 is a diagram illustrating an exemplary range in which components included in the reception devices 100 of the first embodiment and the reception device 200 of the second embodiment are implemented as integrated circuits. In the reception devices described in the first and second embodiments, the tuner 302, the ADC 303, the guadrature demodulation section 304, the level detection section 305, the timing control section 6 or 60, the synchronization section 307, the FFT section 308, the equalization section 9 or 90, and the error correction section 310 can be respectively implemented as LSIs, integrated circuits. These components may be individually integrated on a single chip or may also be integrated on a single chip so as to include a part or the whole thereof. Here, the term, LSI is used, but it may also be referred to as IC, system LSI, super LSI or ultra-LSI or the like depending on the difference in the degree of integration.

Furthermore, the technique of implementing an integrated circuit is not limited to an LSI, but an integrated circuit may also be implemented with a dedicated circuit or general-purpose processor. It is also possible to use an FPGA (Field Programmable Gate Array) which is programmable after manufacturing an LSI or a reconfigurable processor whereby connections or settings of circuit cells inside the LSI are reconfigurable. Moreover, when technologies for implementing an integrated circuit substitutable for an LSI emerges with the advance of semiconductor technology or other derived technologies, those technologies may of course be used to integrate functional blocks.

INDUSTRIAL APPLICABILITY

The present invention is applicable to a reception device, of an OFDM signal, using the stepped AGC, and more particularly applicable when it is desired, for example, to cancel an estimated error of a transmission path characteristic.

The invention claimed is:

1. A reception device for receiving an OFDM signal, the reception device comprising:
a variable gain amplifier operable to amplify the OFDM signal based on an amplification gain varied discretely in accordance with an AGC control signal;
a level detection section operable to detect a level of the amplified OFDM signal and to generate the AGC control signal in order to maintain the detected level at a constant;
an FFT section operable to perform a fast Fourier transform in a portion of the amplified OFDM signal;
a timing control section operable to control a timing of varying the amplification gain so that the amplification gain varies in other portions of the OFDM signal on which no fast Fourier transform is performed; and
an equalization section operable to detect distortions of a plurality of reference subcarriers regularly included in the OFDM signal, to estimate distortions of data subcarriers by performing an interpolation using the detected distortions, and to equalize the OFDM signal using the estimated distortions, wherein
the equalization section corrects an estimated error of the estimated distortions of the data subcarriers in accordance with a discrete variation of the amplification gain notified by the AGC control signal.

2. A reception device for receiving an OFDM signal, the reception device comprising:
a variable gain amplifier operable to amplify the OFDM signal based on an amplification gain varied discretely in accordance with an AGC control signal;
a level detection section operable to detect a level of the amplified OFDM signal and to generate the AGC control signal in order to maintain the detected level at a constant;
an FFT section operable to perform a fast Fourier transform in a portion of the amplified OFDM signal;
a timing control section operable to control a timing of varying the amplification gain so that the amplification gain varies in other portions of the OFDM signal on which no fast Fourier transform is performed; and
an equalization section operable to detect distortions of a plurality of reference subcarriers regularly included in the OFDM signal, to estimate distortions of data subcarriers by performing an interpolation by using the detected distortions, and to equalize the OFDM signal by using the estimated distortions, wherein
the equalization section includes:
a transmission path coefficient correction section operable to calculate, by using the AGC control signal, a correction coefficient indicating a difference between a level of the AGC control signal corresponding to a symbol on which the equalization is to be executed and a level of the AGC control signal corresponding to a symbol used for the equalization,
a time axis interpolation section operable to estimate distortions of a portion of a plurality of data subcarriers included in the symbol on which the equalization is to be executed, by performing a time axis interpolation using the detected distortions of the reference subcarriers included in the symbol used for the equalization, the time axis interpolation canceling an interpolation error in accordance with the correction coefficient;
a frequency axis interpolation section operable to estimate distortions of another portion of the plurality of data subcarriers included in the symbol on which the equalization is to be executed, by performing a frequency axis interpolation using the estimated distortions of the portion of the plurality of data subcarriers and the detected distortions of the reference subcarriers included in the symbol on which the equalization is to be executed; and a complex division section operable to divide the plurality of data subcarriers included in the symbol on which the equalization is to be executed by the estimated distortions of the plurality of data subcarriers.

3. A reception device for receiving an OFDM signal, the reception device comprising:

a variable gain amplifier operable to amplify the OFDM signal based on an amplification gain varied discretely in accordance with an AGC control signal;

a level detection section operable to detect a level of the amplified OFDM signal and to generate the AGC control signal which provides the variable gain amplifier with the amplification gain in order to maintain the detected level at a constant;

an FFT section operable to perform a fast Fourier transform in a portion of the amplified OFDM signal;

a timing control section operable to output the AGC control signal to the variable gain amplifier at a timing of varying the amplification gain of the OFDM signal in other portions of the OFDM signal on which no fast Fourier transform is performed; and an equalization section operable to detect distortions of a plurality of reference subcarriers regularly included in the OFDM signal, to estimate distortions of data subcarriers by performing an interpolation by using the detected distortions, and to equalize the OFDM signal by using the estimated distortions, wherein the timing control section further detects the AGC control signal in which a phase variation of the OFDM signal to be amplified exceeds a predetermined threshold value, and the equalization section includes:

a transmission path coefficient correction section operable to calculate, by using the AGC control signal, a correction coefficient indicating a difference between a level of the AGC control signal corresponding to a symbol on which the equalization is to be executed and a level of the AGC control signal corresponding to a symbol used for the equalization;

a time axis interpolation section operable to estimate distortions of a portion of a plurality of data subcarriers included in the symbol on which the equalization is to be executed, by performing a time axis interpolation using the detected distortions of the reference subcarriers included in the symbol used for the equalization, the time axis interpolation canceling an interpolation error in accordance with the correction coefficient;

a switch operable to input the estimated distortions of the portion of the plurality of data subcarriers and to output the estimated distortions only for a period during which the phase variation of the OFDM signal calculated from the AGC control signal does not exceed the predetermined threshold value;

a frequency axis interpolation section operable to, when the switch outputs the portion of the distortions, estimate distortions of another portion of the plurality of data subcarriers included in the symbol on which the equalization is to be executed, by performing a frequency axis interpolation using the estimated distortions of the portion of the plurality of data subcarriers and the detected distortions of the reference subcarriers included in the symbol on which the equalization is to be executed, and, when the switch does not output the portion of the distortions of the plurality of data subcarriers included in the symbol on which the equalization is to be executed, to estimate the distortions of the reference subcarriers included in the symbol on which the equalization process is to be executed, by performing a frequency axis interpolation using the detected distortions of the reference subcarriers included in the symbol on which the equalization is to be executed; and a complex division section operable to divide the plurality of data subcarriers included in the symbol on which the equalization is to be executed by the estimated distortions of the plurality of data subcarriers.

4. A reception method of receiving an OFDM signal, the reception method comprising:

amplifying the OFDM signal based on an amplification gain varied discretely in accordance with an AGC control signal;

detecting a level of the amplified OFDM signal and generating the AGC control signal in order to maintain the detected level at a constant;

performing a fast Fourier transform in a portion of the amplified OFDM signal;

controlling a timing of varying the amplification gain so that the amplification gain varies in other portions of the OFDM signal on which no fast Fourier transform is performed; and detecting distortions of a plurality of reference subcarriers regularly included in the OFDM signal, estimating distortions of data subcarriers by performing an interpolation using the detected distortions, and equalizing the OFDM signal using the estimated distortions, wherein in the estimation of distortions of data subcarriers, an estimated error of the estimated distortions of the data subcarriers is corrected in accordance with a discrete variation of the amplification gain notified by the AGC control signal.

5. A reception method of receiving an OFDM signal, the reception method comprising:

amplifying the OFDM signal based on an amplification gain varied discretely in accordance with an AGC control signal;

detecting a level of the amplified OFDM signal and generating the AGC control signal in order to maintain the detected level at a constant;

performing a fast Fourier transform in a portion of the amplified OFDM signal;

controlling a timing of varying the amplification gain so that the amplification gain varies in other portions of the OFDM signal on which no fast Fourier transform is performed;

detecting distortions of a plurality of reference subcarriers regularly included in the OFDM signal;

calculating, by using the AGC control signal, a correction coefficient indicating a difference between a level of the AGC control signal corresponding to a symbol on which equalization is to be executed and a level of the AGC control signal corresponding to a symbol used for the equalization;

estimating distortions of a portion of a plurality of data subcarriers included in the symbol on which the equalization is to be executed, by performing a time axis interpolation using the detected distortions of the reference subcarriers included in the symbol used for the equalization, the time axis interpolation canceling an interpolation error in accordance with the correction coefficient;

estimating distortions of another portion of the plurality of data subcarriers included in the symbol on which the equalization is to be executed, by performing a frequency axis interpolation using the estimated distortions of the portion of the plurality of data subcarriers and the detected distortions of the reference subcarriers included in the symbol on which the equalization is to be executed; and dividing the plurality of data subcarriers included in the symbol on which the equalization is to be executed by the estimated distortions of the plurality of data subcarriers.

6. A reception method of receiving an OFDM signal, the reception method comprising:

amplifying the OFDM signal based on an amplification gain varied discretely in accordance with an AGC control signal;

detecting a level of the amplified OFDM signal and generating the AGC control signal in order to maintain the detected level at a constant;

performing a fast Fourier transform in a portion of the amplified OFDM signal;

controlling a timing of varying the amplification gain so that the amplification gain varies in other portions of the OFDM signal on which no fast Fourier transform is performed;

detecting distortions of a plurality of reference subcarriers regularly included in the OFDM signal;

calculating, by using the AGC control signal, a correction coefficient indicating a difference between a level of the AGC control signal corresponding to a symbol on which equalization is to be executed and a level of the AGC control signal corresponding to a symbol used for the equalization;

estimating distortions of a portion of a plurality of data subcarriers included in the symbol on which the equalization is to be executed, by performing a time axis interpolation using the detected distortions of the reference subcarriers included in the symbol used for the equalization, the time axis interpolation canceling an interpolation error in accordance with the correction coefficient;

inputting the estimated distortions of the portion of the plurality of data subcarriers and outputting the estimated distortions only for a period during which a phase variation of the OFDM signal calculated from the AGC control signal does not exceed a predetermined threshold value;

when the portion of the distortions is outputted, estimating distortions of another portion of the plurality of data subcarriers included in the symbol on which the equalization is to be executed, by performing a frequency axis interpolation using the estimated distortions of the portion of the plurality of data subcarriers and the detected distortions of the reference subcarriers included in the symbol on which the equalization is to be executed, and, when the portion of the distortions of the plurality of data subcarriers included in the symbol on which the equalization is to be executed is not outputted, estimating the distortions of the reference subcarriers included in the symbol on which the equalization process is to be executed, by performing a frequency axis interpolation using the detected distortions of the reference subcarriers included in the symbol on which the equalization is to be executed; and dividing the plurality of data subcarriers included in the symbol on which the equalization is to be executed by the estimated distortions of the plurality of data subcarriers.

* * * * *